(12) United States Patent
Wan et al.

(10) Patent No.: US 9,431,247 B2
(45) Date of Patent: Aug. 30, 2016

(54) METHOD FOR ION IMPLANTATION

(71) Applicant: ADVANCED ION BEAM TECHNOLOGY, INC., Hsinchu (TW)

(72) Inventors: Zhimin Wan, Sunnyvale, CA (US); Kourosh Saadatmand, Merrimac, MA (US); Wilhelm P. Platow, Salem, MA (US); Ger-Pin Lin, Tainan (TW); Ching-I Li, Tainan (TW); Rekha Padmanabhan, Sunnyvale, CA (US); Gary N. Cai, Grandview, MO (US)

(73) Assignee: ADVANCED ION BEAM TECHNOLOGY, INC., Hsinchu (TW)

( * ) Notice: Subject to any disclaimer, the term of this patent is extended or adjusted under 35 U.S.C. 154(b) by 0 days.

(21) Appl. No.: 14/752,522

(22) Filed: Jun. 26, 2015

(65) Prior Publication Data

US 2016/0133469 A1    May 12, 2016

(30) Foreign Application Priority Data

Nov. 11, 2014  (TW) .............................. 103138995 A

(51) Int. Cl.
*H01L 21/265* (2006.01)
*H01J 37/302* (2006.01)

(52) U.S. Cl.
CPC ...... *H01L 21/26586* (2013.01); *H01J 37/3026* (2013.01)

(58) Field of Classification Search
CPC ..................... H01L 21/26586; H01J 37/3026
USPC .............. 438/525; 250/396 R, 492.2, 492.22
See application file for complete search history.

(56) References Cited

U.S. PATENT DOCUMENTS 5,422,490 A    6/1995  Nakamura et al.
8,164,070 B2   4/2012  Nicolaescu
(Continued)

FOREIGN PATENT DOCUMENTS

CN      105280466 A     1/2016
KR    1020110081980 A   7/2011
(Continued)

OTHER PUBLICATIONS

C.I. Li et al., "Integrated divergent beam for FinFET Conformal Doping," Ion Implantation Technology (IIT), 20th International Conference, Jun. 30, 2014, 5 pp.

*Primary Examiner* — Karen Kusumakar
(74) *Attorney, Agent, or Firm* — Muncy, Geissler, Olds & Lowe, P.C.

(57) ABSTRACT

A method for an ion implantation is provided. First, a non-parallel ion beam is provided. Thereafter, a relative motion between a workpiece and the non-parallel ion beam, so as to enable each region of the workpiece to be implanted by different portions of the non-parallel ion beam successively. Particularly, when at least one three-dimensional structure is located on the upper surface of the workpiece, both the top surface and the side surface of the three-dimensional structure may be implanted properly by the non-parallel ion beam when the workpiece is moved across the non-parallel ion beam one and only one times. Herein, the non-parallel ion beam can be a divergent ion beam or a convergent ion beam (both may be viewed as the integrated divergent beam), also can be generated directly from an ion source or is modified from a parallel ion beam, a divergent ion beam or a convergent ion beam.

14 Claims, 32 Drawing Sheets

(56) References Cited

U.S. PATENT DOCUMENTS

| | | |
|---|---|---|
| 2006/0006346 A1 | 1/2006 | Rathmell et al. |
| 2010/0065761 A1 | 3/2010 | Graf et al. |
| 2015/0228445 A1* | 8/2015 | Chang ................ H01J 37/1474 250/394 R |

FOREIGN PATENT DOCUMENTS

| | | |
|---|---|---|
| KR | 10-2014-173090 | 12/2014 |
| KR | 10-2015-0091253 | 6/2015 |
| KR | 1020160001565 A | 1/2016 |
| TW | 521295 B | 2/2003 |
| TW | I293767 | 2/2008 |
| TW | 200908057 A1 | 2/2009 |
| TW | 201123274 A1 | 7/2011 |
| TW | 103122293 | 6/2014 |
| TW | 103138995 | 11/2014 |

* cited by examiner

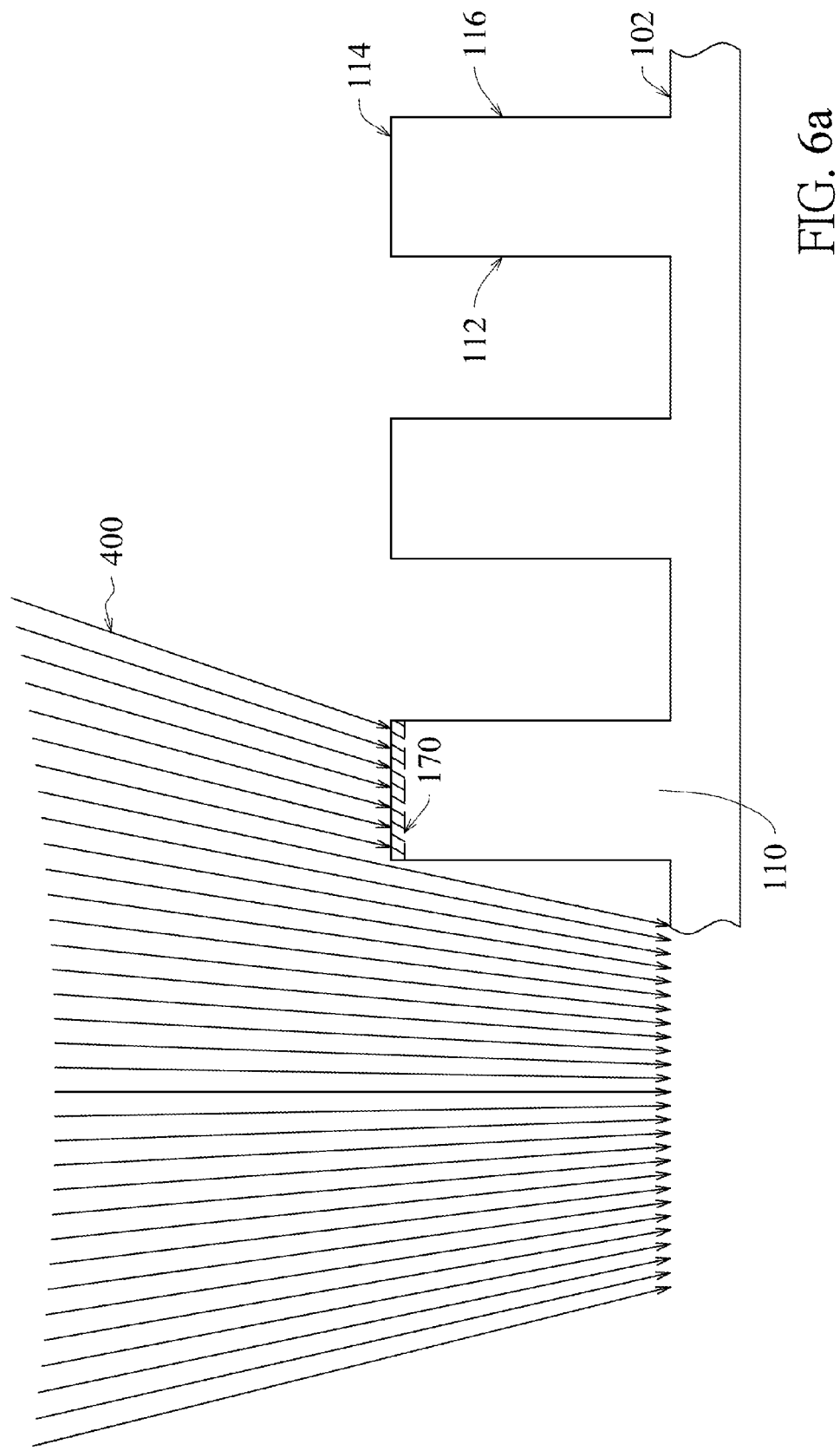

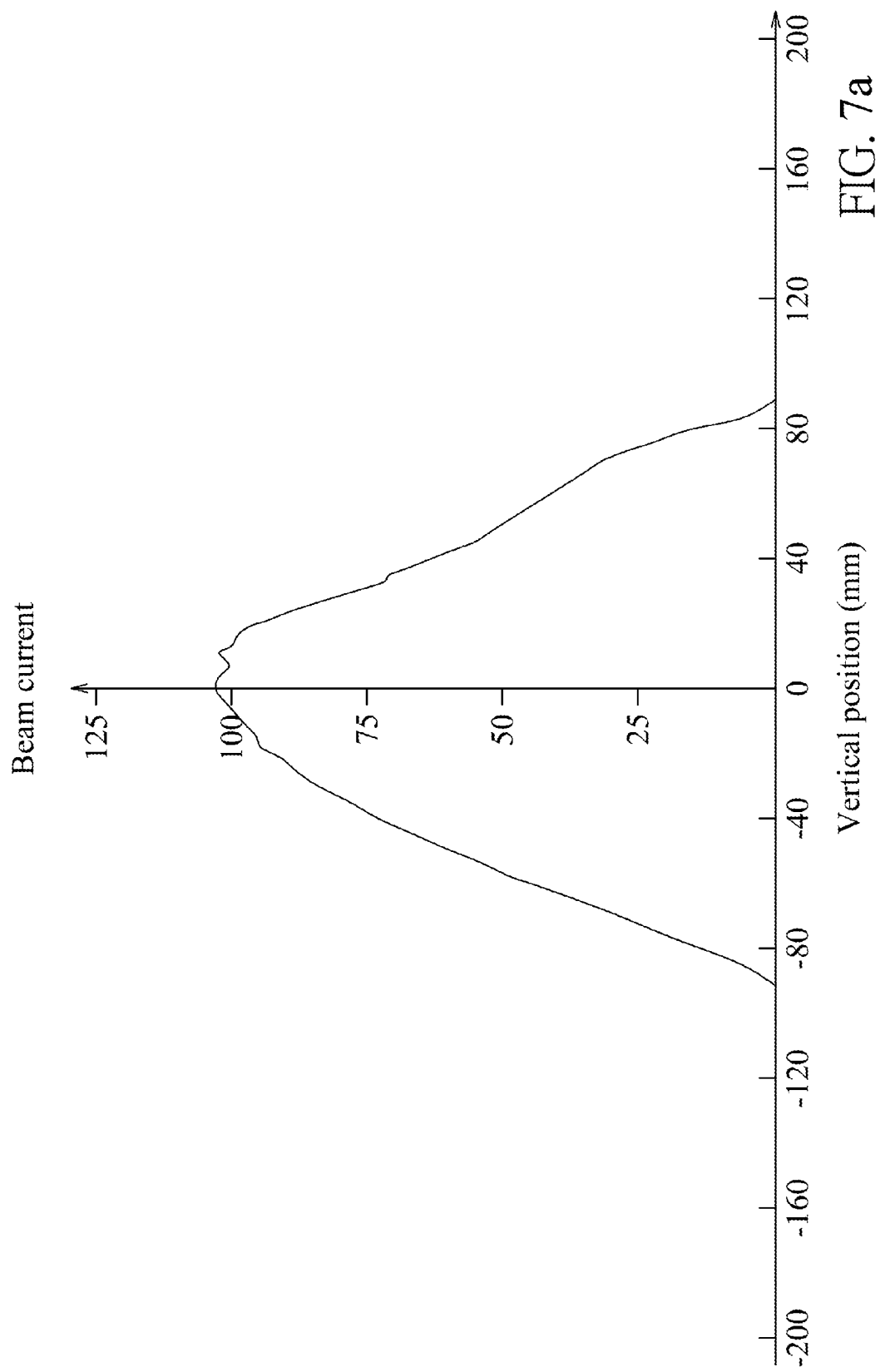

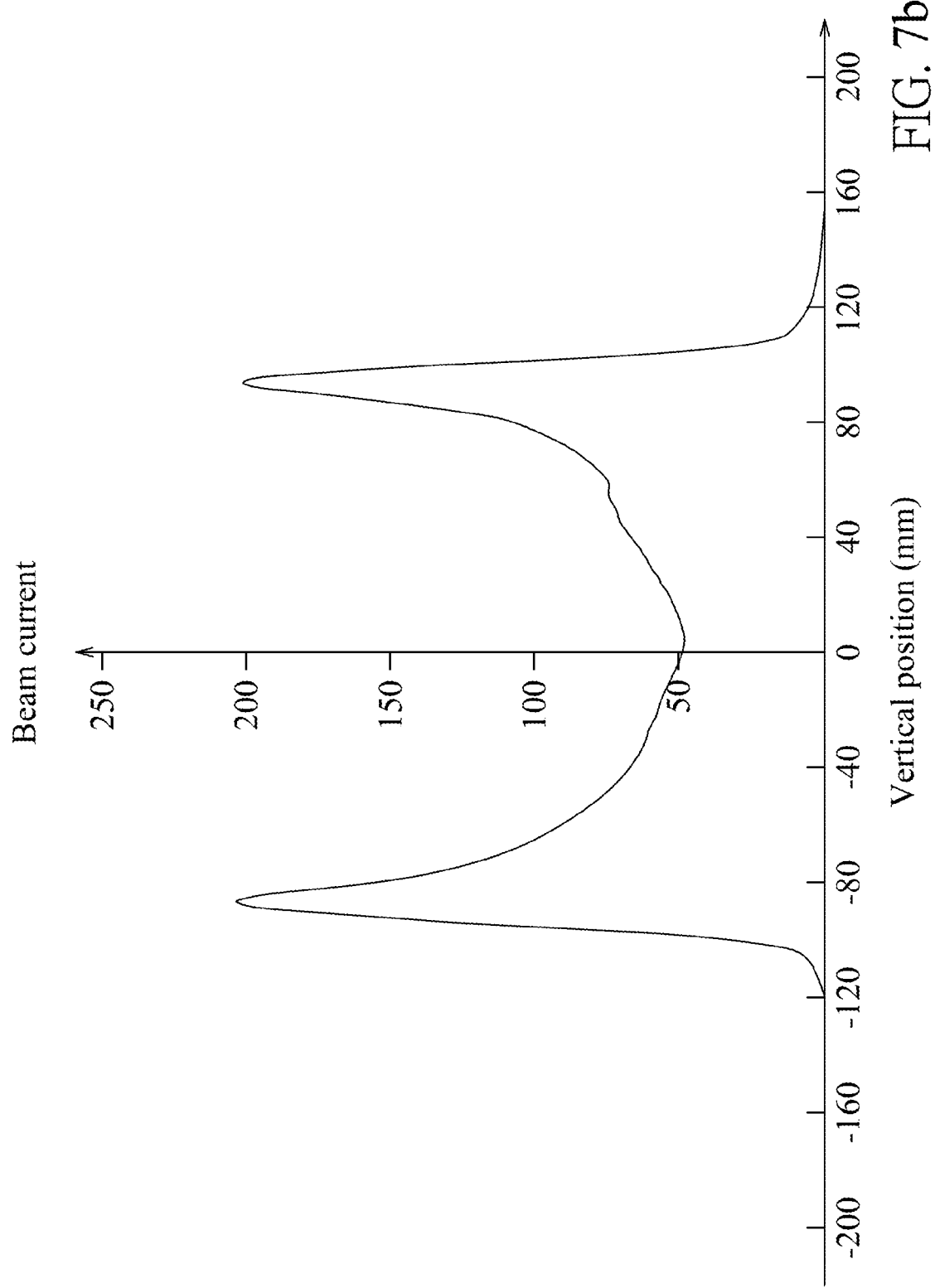

METHOD FOR ION IMPLANTATION

FIELD OF THE INVENTION

The present invention generally relates to a method for an ion implantation, and more particularly to a method for an ion implantation with a non-parallel ion beam and a solution for conformal FinFET doping method.

DESCRIPTION OF THE RELATED ART

With regard to the semiconductor manufacturing field, the researches of the ion beam usually focus on ways to ensure the generated ion beam more collimated and more uniform by using the optical component(s), such as the magnetic component(s) and the electric component(s), for controlling an implantation result more easily. As usual, for the available commercial implanters, the divergent angle or the convergent angle of the collimated ion beam is almost far less than 3 degrees and then the collimated ion beam is substantially considered as a parallel ion beam.

Such collimated and parallel ion beam has been popularly used to manufacture many semiconductor structures, such as planar Field-Effect Transistor, dynamic mummeries and other. Also, it has been used to manufacture solar cell, light-emit-diode (LED) or other products. However, when some new semiconductor structures, such as Fin Field-Effect Transistor (FinFET) or other 3D structures are newly developed in the past years, the usage and the efficiency of such collimated parallel ion beam is limited, because at least the parallel ion beam can not effectively implant different side of a 3D structure synchronously.

FIG. 1 illustrates a perspective structural view of a conventional FinFET, while FIGS. 2a to 2i illustrate a process which uses the conventional collimated parallel ion beam to manufacture the FinFET as shown in FIG. 1. For example, referring to FIG. 1 first, during the manufacture of the FinFET 100, in order to form a source and a drain on each fin structure 110 of the FinFET 100, it is necessary to use an ion beam to selectively implant specific regions of the FinFET 100, such as all of a left side surface 112, a top surface 114 and a right side surface 116 of each fin structure 110 and part of an upper surface 102 of the FinFET 100. However, by using a conventional parallel ion beam 200, because the three surfaces of each fin structure 110 are not positioned on the same plane perpendicular to the direction of the parallel ion beam 200, it is necessary to implant all of the left side surfaces 112, the top surface 114 and the right side surface 116 of the fin structures 110 by using the collimated parallel ion beam with three different incident directions 210, 220 and 230 respectively along a scan direction 300.

As shown in FIGS. 2a to 2c, the ion beam 200 with the incident direction 210 is used for implanting the left side surfaces 112 and all of the top surfaces 114, but none of the right side surfaces 116. Note that left side surface 112 of each fin structure 110 may be partially blocked another fin structure 110 positioned on its' left side, due to at least the height of the fin structure 110, the incident angle 210 and the distance between neighboring fin structure 210 along the scan direction 300 (Such effect may be viewed as the shadowing effect). As shown in FIGS. 2d to 2f, the ion beam 200 with the incident direction 220 is used for implanting all of the top surfaces 114 and part of the upper surface 102. Clearly, both the lift surface 112 and the right surface 116 are not implanted under such situation. As shown in FIGS. 2g to 2i. while the ion beam 200 with the incident direction 230 is used for implanting the right side surfaces 116 and all of the top surfaces 114, but none of the left side surfaces 112. Similarly, right side surface 116 of each fin structure 110 may be partially blocked another fin structure 110 positioned on its' right side, due to at least the height of the fin structure 110, the incident angle 230 and the distance between neighboring fin structure 210 along the scan direction 300.

Accordingly, by using the parallel ion beam 200, both the source and the drain of a conventional planar Field-Effect transistor may be implanted simultaneous but the three surfaces 112/114/116 of each fin structure 110 should be implanted respectively. Therefore, the total time spent on the implantation procedure for implanting the FinFET 100 is obviously longer than that for implanting a conventional 2D semiconductor structure.

Particularly, for the fin structure 110, the top and the bottom may be implanted well and having higher dopant concentration but the body (i.e. the sidewall of the fin structure 110) may be less implanted and having lower dopant concentration. For each single fin structure 110, such non-conformal dopant distribution may be improved by tilt implantation, especially by high tilt implantation. Nevertheless, when numerous fin structures 110 usually are separated distributed on the workpiece, the cosine effect at higher tilt angles may induce retained dose lose, also the showing effect between neighboring fin structures 110 may restrict the available tile angle. Hence, how to increase the dopant concentration and the dopant uniformity on the fin structure 110, especially that on the sidewall of the fin structure 110, is still an issue.

As a result, it is desired to provide a new ion implantation method.

SUMMARY OF THE INVENTION

The present invention is directed to a method for an ion implantation, which scans a workpiece by using a non-parallel ion beam, so as to enable each region of the workpiece to be implanted by different portions of the non-parallel ion beam successively. Particularly, when at least one three-dimensional structure is located on the upper surface of the workpiece, both the top surface and the side surface of the three-dimensional structure may be implanted properly by the non-parallel ion beam when the non-parallel ion beam scans through the workpiece one and only one times.

The present invention provides a method for an ion implantation, which comprises the following steps. First, provides a non-parallel ion beam, Afterward, generates a relative motion between a workpiece and the non-parallel ion beam, so as to enable each region of the workpiece to be implanted by different portions of the non-parallel ion beam successively. Wherein, the non-parallel ion beam is a divergent ion beam or a convergent ion beam.

Wherein the step for providing the non-parallel ion beam comprises: providing an ion beam; and modifying the ion beam into the non-parallel ion beam. Wherein the ion beam is a parallel ion beam, a divergent ion beam or a convergent ion beam. Wherein the step for modifying the ion beam into the non-parallel ion beam comprises at least one of the following: (a) uses at least an optical component to diverge the ion beam into the non-parallel ion beam as a divergent ion beam. (b) uses at least an optical component to converge the ion beam into the non-parallel ion beam as a convergent ion beam. (c) uses at least an optical component to converge the ion beam into a convergent ion beam, so as to enable the convergent ion beam to form the non-parallel ion beam as a divergent ion beam after focusing. (d) uses at least a first optical component to converge the ion beam into a convergent ion beam, and further uses at least a second optical component to diverge the convergent ion beam into the non-parallel ion beam as a convergent ion beam. (e) uses at least a first optical component to converge the ion beam into a convergent ion beam, and further uses at least a second optical component to diverge the convergent ion beam into the non-parallel ion beam as a divergent ion beam. (f) uses at least a first optical component to converge the ion beam into a convergent ion beam, and further uses at least a second optical component to converge the convergent ion beam into the non-parallel ion beam as a convergent ion beam. (g) uses at least a first optical component to diverge the ion beam into a divergent ion beam, and further uses at least a second optical component to converge the divergent ion beam into the non-parallel ion beam as a convergent ion beam. (h) uses at least a first optical component to diverge the ion beam into a divergent ion beam, and further uses at least a second optical component to converge the divergent ion beam into the non-parallel ion beam as a divergent ion beam. (i) uses at least a first optical component to diverge the ion beam into a divergent ion beam, and further uses at least a second optical component to diverge the divergent ion beam into the non-parallel ion beam as a divergent ion beam. (j) uses at least a first optical component to diverge the ion beam into a divergent ion beam, and further uses at least a second optical component to converge the divergent ion beam into a convergent ion beam, so as to enable the convergent ion beam to form the non-parallel ion beam as a divergent ion beam after focusing According to an embodiment of the present invention, at least one three-dimensional structure is located on the upper surface of the workpiece, wherein both the top surface and the side surface of the three-dimensional structure should be implanted.

According to an embodiment of the present invention, the direction of the relative motion intersects with the top surface and the side surface of the three-dimensional structure.

According to an embodiment of the present invention, each of the top surface and the side surface of the three-dimensional structure is implanted by different portions of the ion-parallel ion beam successively.

According to an embodiment of the present invention, wherein the step for providing the non-parallel ion beam comprises: providing an ion beam, and modifying the ion beam into the non-parallel ion beam. Wherein the ion beam is a parallel ion beam, a divergent ion beam or a convergent ion beam.

According to an embodiment of the present invention, the potential structure of the optical component may be a magnetic quadruple applying a quadruple magnetic field on the ion beam, a magnetic component having a plurality of coils positioned on two separated rods wherein the two rods are positioned on two opposite sides of the ion beam, or an electric element having a plurality of electrodes positioned on two separated rods wherein the two rods are positioned on two opposite sides on the ion beam.

According to an embodiment of the present invention, the method further comprising using different optical components to converge or diverge different portions of the ion beam during modifying the ion beam into the non-parallel ion beam.

According to an embodiment of the present invention, 1, the method further comprising at least one of the following before the workpiece being implanted by the non-parallel ion beam: blanking some ions away the non-parallel ion beam; decreasing an ion concentration of at least a portion of the non-parallel ion beam; modifying the non-parallel ion beam uniformly; and modifying the non-parallel ion beam non-uniformly.

According to an embodiment of the present invention, the method further comprising at least one of the following: (a) the angular difference between the non-parallel ion beam and a parallel ion beam is equal to or smaller than 15 degrees when the ion beam is a spot ion beam, and wherein the angular difference between the non-parallel ion beam and a parallel ion beam is equal to or smaller than 5 degrees when the ion beam is a ribbon ion beam; (b) when the ion beam is modified into a non-parallel ion beam having a divergent angle, the divergent angle of the non-parallel ion beam is larger than or equal to 3 degrees and smaller than or equal to 10 degrees, larger than 5 degrees and smaller than 15 degrees, not smaller than 4 degrees and not larger than 8 degrees, smaller than 18 degrees and larger than 2 degree, or larger than 8 degrees; and (c) when the ion beam is modified into a non-parallel ion beam having a convergent angle, the convergent angle of the non-parallel ion beam is larger than or equal to 3 degrees and smaller than or equal to 10 degrees, larger than 5 degrees and smaller than 15 degrees, not smaller than 4 degrees and not larger than 8 degrees, smaller than 18 degrees and larger than 2 degree, or larger than 8 degrees.

According to an embodiment of the present invention, the method further comprises at least one of the following during the relative motion between a workpiece and the non-parallel ion beam: (a) linearly driving the workpiece to move across the non-parallel ion beam; and (b) driving the workpiece to tilt relative to a transmission path the non-parallel ion beam.

The present invention is directed to a method for implantation, which provides and implants an integrated divergent beam (IDB) into a workpiece having one or more three-dimensional structures. Herein, the sidewall of each three-dimensional structure is tilt to the surface. Hence, because the IDB may be a divergent ion beam or a convergent ion beam, the IDB consists of various implant angle distribution and then different portions of the IDB may be implanted into different portions of the sidewalls of the three-dimensional structures (i.e., different portions of the sidewalls of the three-dimensional structures may be implanted by different incidence angles), even different portions of the IDB may be reflected from different portions of one sidewall of one three-dimensional structure to different portions of another sidewall of another three-dimensional structure (i.e. more ion reflections happened on the sidewall of the three-dimension structure). Hence, when the IDB but not the conventional collimated ion beam is used, the sidewalls of these three-dimensional structures may be more effectively implanted and then the dopant concentration is more uniform from the top through the sidewall to the bottom for these three-dimensional structures.

According to an embodiment of the present invention, a workpiece having numerous tapered fins are implanted by an IDB. The IDB may be perpendicularly implanted into the workpiece or tilted implanted into the workpiece.

According to an embodiment of the present invention, an IDB is used to implant three-dimensional structure whose sidewall is not totally perpendicular to the top surface of the workpiece where the three-dimensional structure is positioned. Herein, the divergent angle or the convergent beam of the IDB usually is on a range from five degrees to fifteen degrees, also may be on other range, such as less than thirty degrees, larger than three degrees or from fifteen degrees to twenty-five degrees.

According to an embodiment of the present invention, the beam current distribution of the IDB is formed as a horn shape that the beam current is increased from a beam center to the beam edge

BRIEF DESCRIPTION OF THE DRAWINGS

FIGS. 5a-5e and 6a-6e respectively illustrate an ion implantation process according to an embodiment of the present invention.

FIG. 7a illustrates a beam current distribution in position of a conventional parallel spot beam.

FIG. 7b illustrates a beam current distribution in position of an integrated divergent beam (IDB) according to an embodiment of the present invention.

DETAILED DESCRIPTION OF THE INVENTION

Reference will now be made in detail to specific embodiments of the present invention. Examples of these embodiments are illustrated in the accompanying drawings. While the invention will be described in conjunction with these specific embodiments, it will be understood that it is not intended to limit the invention to these embodiments. In fact, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations are not described in detail in order not to obscure the present invention. Besides, in all of the following embodiments, the same or similar components illustrated in different embodiments refer to the same symbols.

Figure 3:
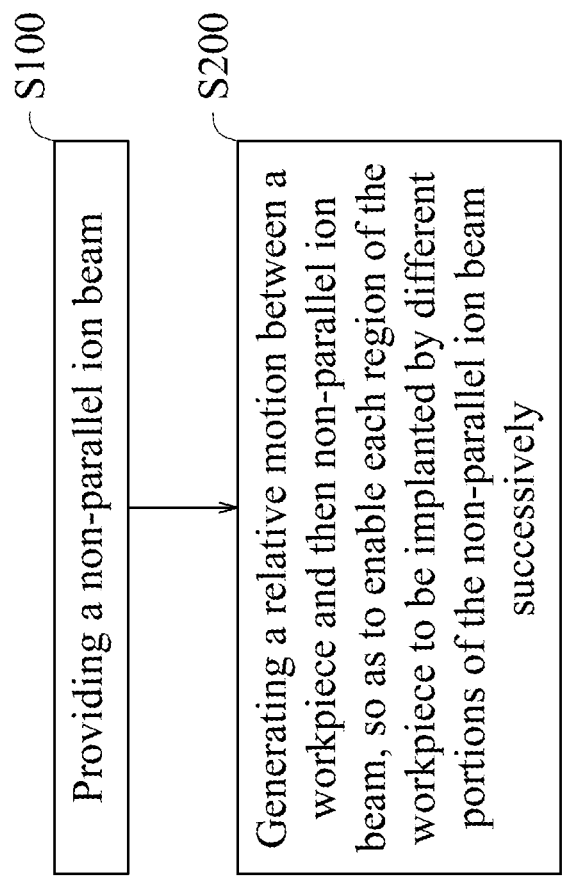
FIGS. 3 and 4 respectively illustrate a flow chart of a method for an ion implantation according to an embodiment of the present invention.
Figure 4:
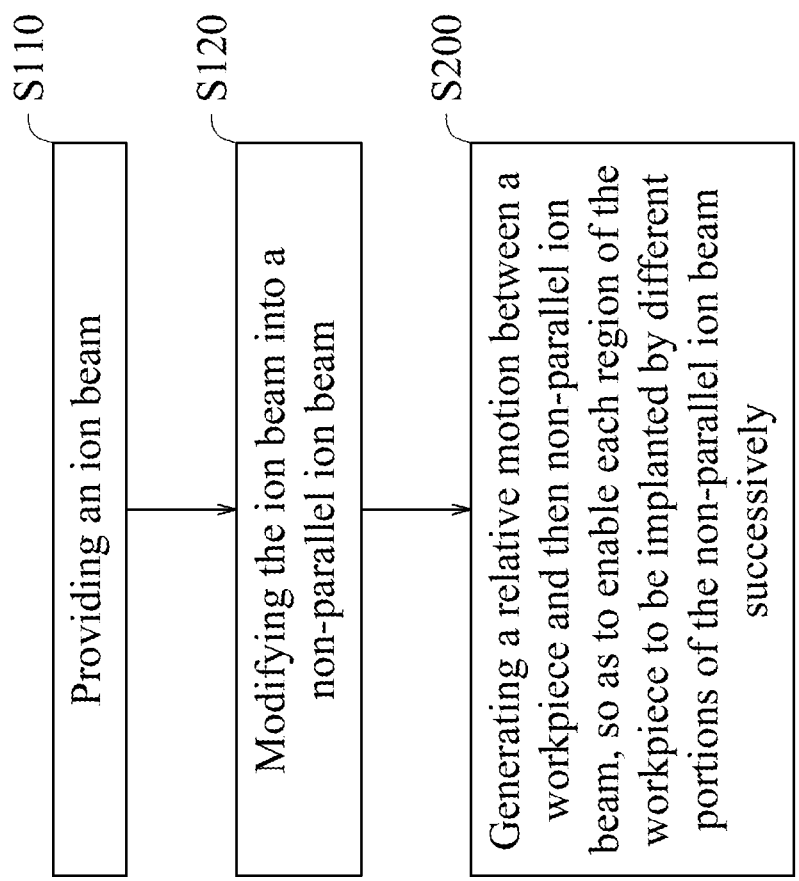

FIGS. 3 and 4 respectively illustrate a flow chart of a method for an ion implantation according to an embodiment of the present invention, and FIGS. 5a-5e and 6a-6e respectively illustrate an ion implantation process according to an embodiment of the present invention. In all of the following embodiments, the same or similar components illustrated in different embodiments refer to the same symbols.

Referring to FIG. 3 first, a method of the present embodiment for an ion implantation comprises the following steps. First, as shown in a block S100, the first step is providing a non-parallel ion beam. Afterward, as shown in a block S200, the second step is generating a relative motion between a workpiece and the non-parallel ion beam, so as to enable each region of the workpiece to be implanted by different portions of the non-parallel ion beam successively. In the present embodiment, the non-parallel ion beam used in the present embodiments can be a divergent ion beam as shown in FIGS. 5a-5e or a convergent ion beam as shown in FIG. 6a-6e. Furthermore, the non-parallel ion beam can be directly generated by an ion source but also can be modified from various types of ion beams originally generated by the ion source and the mass analyzer, such as a parallel ion beam, a divergent ion beam or a convergent ion beam, by using at least a magnetic component, an electronic component or any other commercially available optical component. In a word, referring to FIG. 4, before processing the step as shown in the block S200, it is possible to divide the step as shown in the block S100 of FIG. 3 into a first step of providing an ion beam as shown in a block S110 and a second step of modifying the ion beam into the non-parallel ion beam as shown in a block S120.

For example, the originally generated ion beam can be a parallel ion beam, a divergent ion beam or a convergent ion beam, and then can be directly converged into the non-parallel ion beam as a convergent ion beam or directly diverged into the non-parallel ion beam as a divergent ion beam by using at least an optical component. Alternatively, the originally generated ion beam can be converted into a convergent ion beam by using an optical component first and then further converged into the non-parallel ion beam as another convergent ion beam or diverged into the non-parallel ion beam as a divergent ion beam by using another optical component, or diverged into a divergent ion beam by using an optical component first and then further diverged into the non-parallel ion beam as another divergent ion beam or converged into the non-parallel ion beam as a convergent ion beam by using another optical component. Also, the originally generated ion beam can be directly converged into a convergent ion beam by using at least an optical component or diverged into a divergent ion beam by using an optical component first and then converged into a convergent ion beam by using another optical component, so as to enable the convergent ion beam to form the non-parallel ion beam as a divergent ion beam after focusing. Herein, each one of the above-mentioned optical components can modify the parallel ion beam, the convergent ion beam or the divergent ion beam uniformly or not uniformly, for example, different optical components can be used for selectively converging or diverging different portions of the ion beam according to the requirement of the non-parallel ion beam. Moreover, it is also possible to blank either at least some ions of at least a specific portion of the ion beam during modifying the ion beam into the non-parallel ion beam, or at least some ions of a specific portion of the non-parallel ion beam before the non-parallel ion beam scans the workpiece, so as to decrease an ion concentration of at least a certain region of the workpiece implanted by the specific portion, even prevent the specific portion from implanting the certain region.

It should be noted that the above-mentioned embodiments just briefly instruct the exemplary generation of the non-parallel ion beam modified from an ion beam, the details of the methods and the devices for generating the non-parallel ion beam can further be referred to the Taiwan Patent Application No. 103122293, filed Jun. 27, 2014 by the Applicant, and the entirety of which is hereby incorporated by reference and omitted herein. Furthermore, in order to enable a person having ordinary skilled in the art to have a better understanding, two embodiments, for exemplary illustration without any intention to limit the scope of the present invention, are illustrated.

Figure 1:
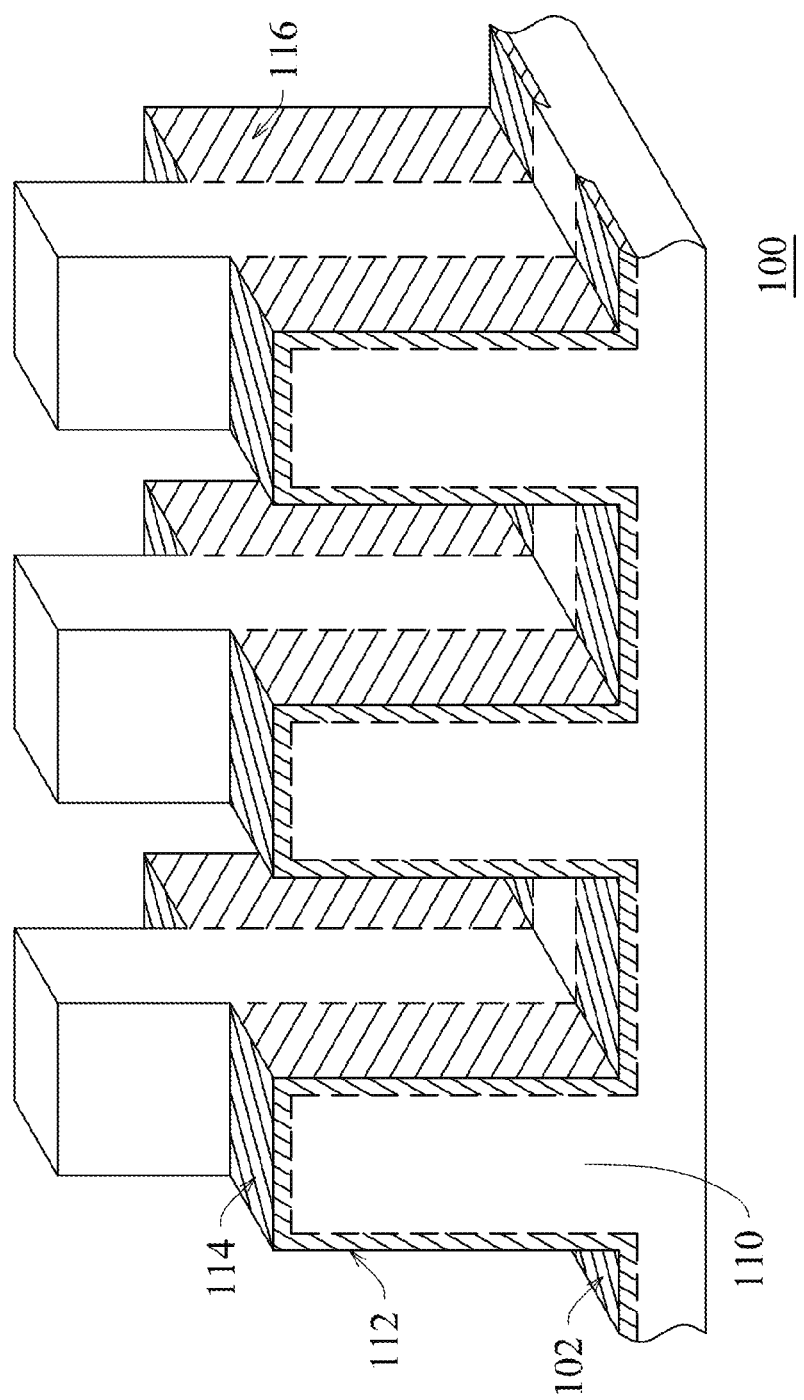
FIG. 1 illustrates a perspective structural view of a conventional FinFET.
Figure 2A:
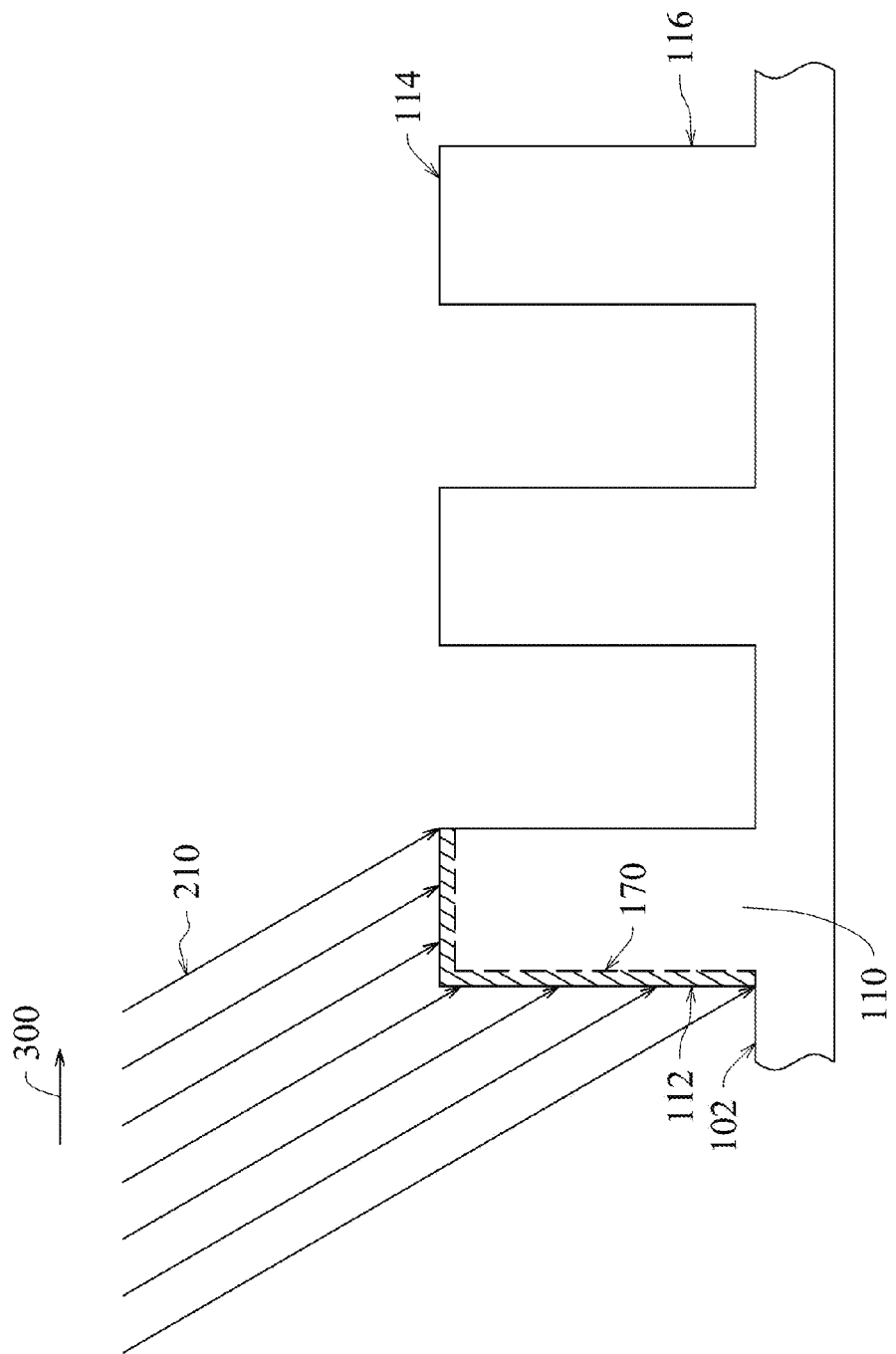
FIGS. 2a-2i illustrate a conventional ion implantation process to the FinFET as shown in FIG. 1.
Figure 2B:
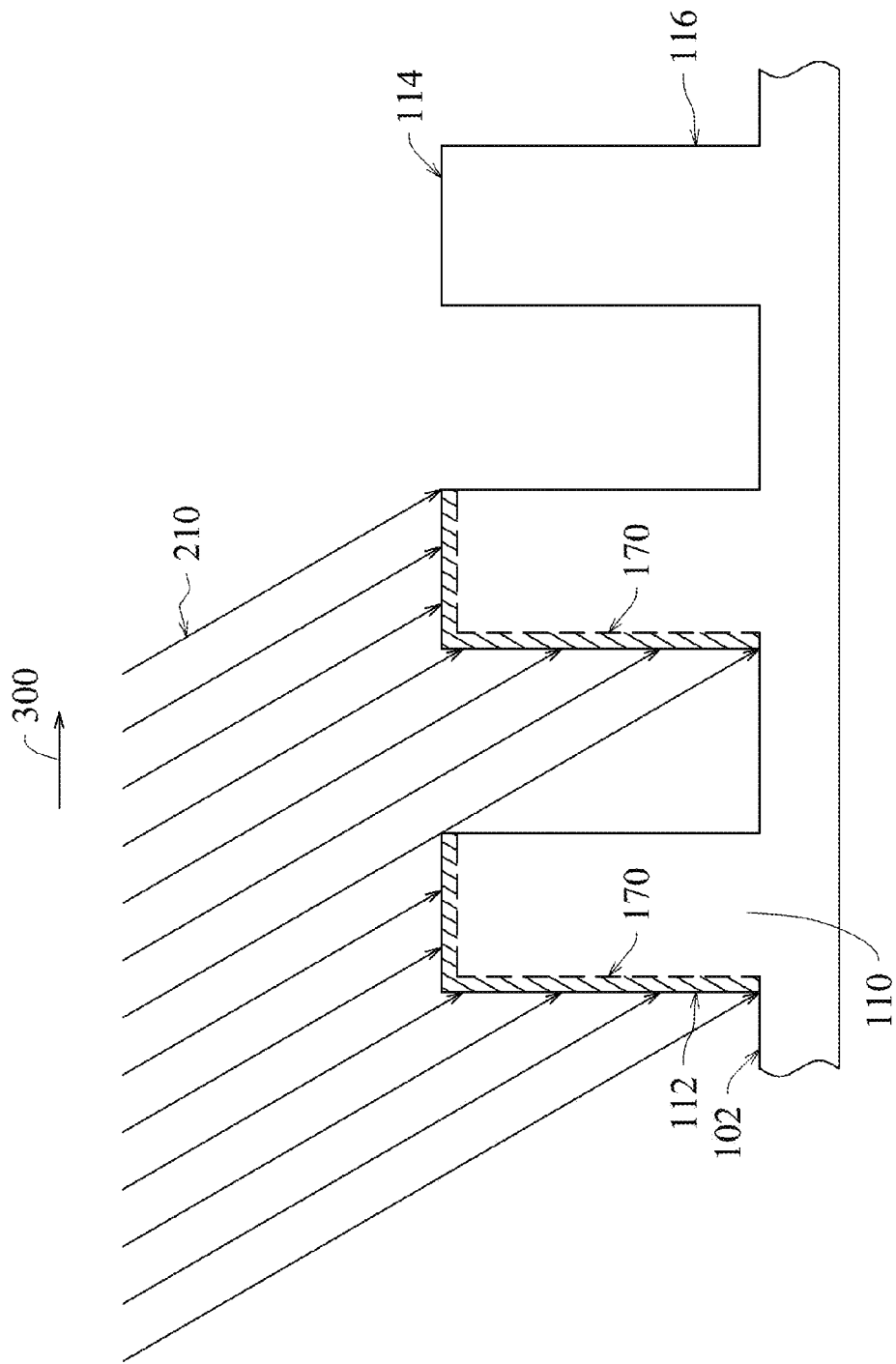
Figure 2C:
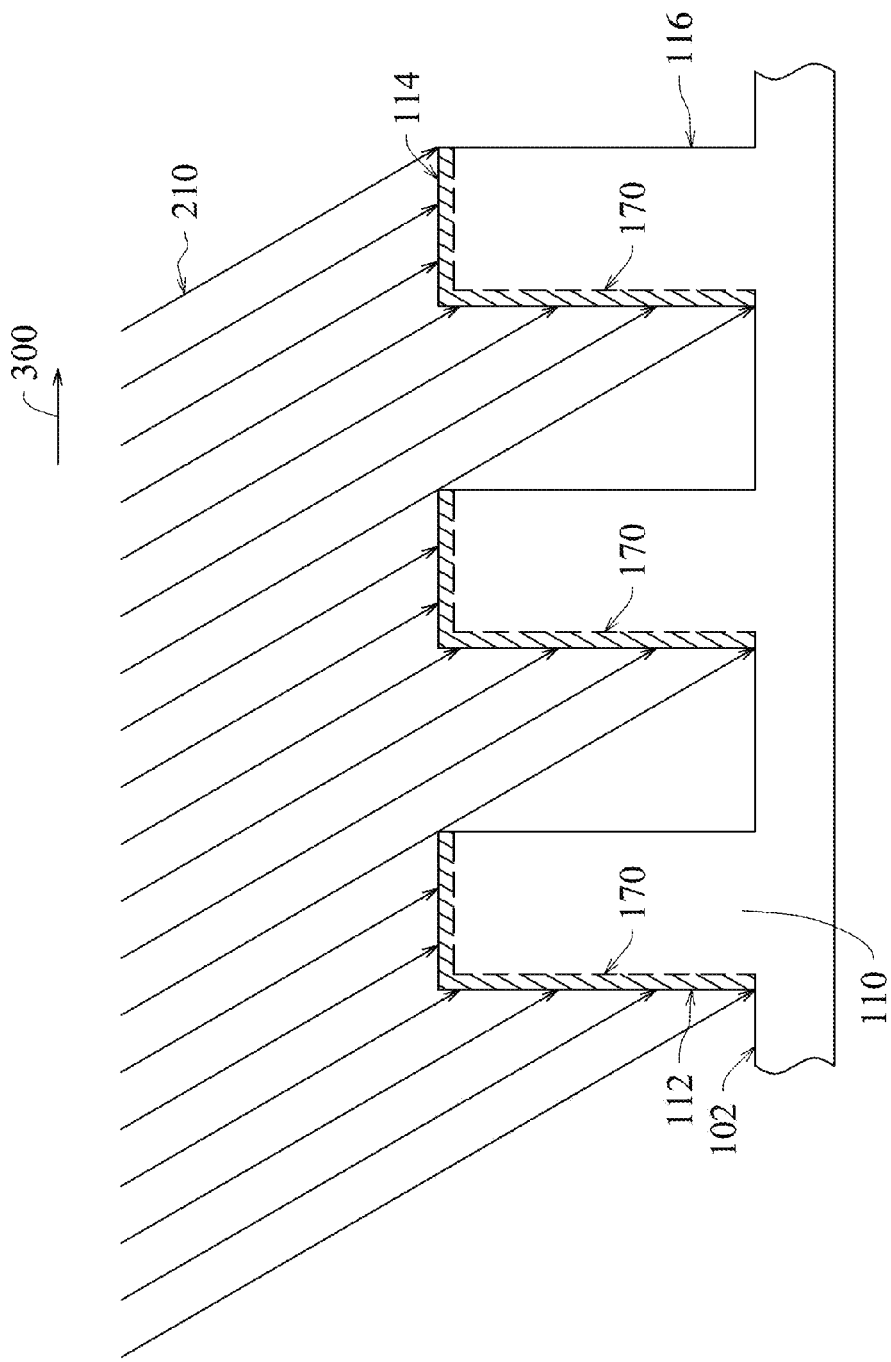
Figure 2D:
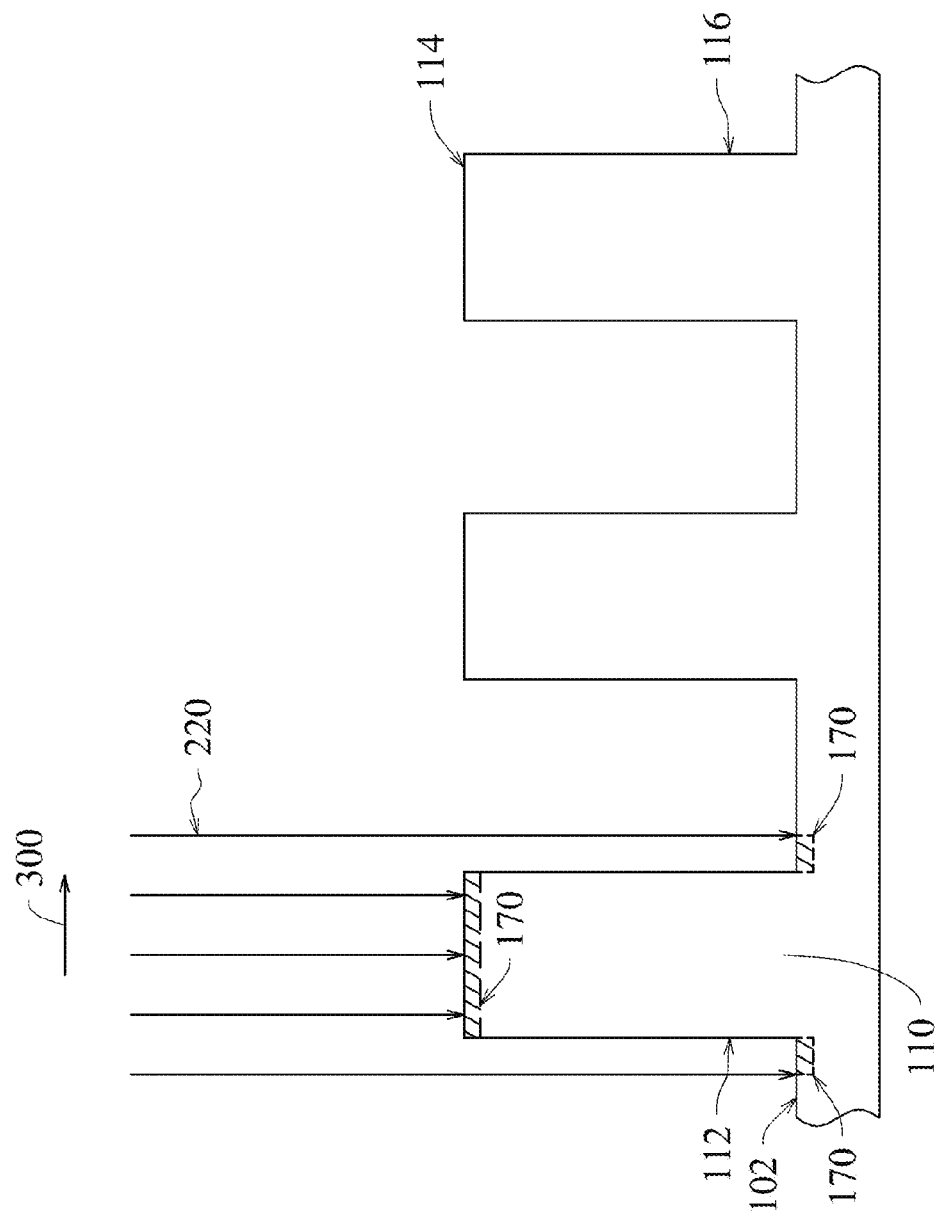
Figure 2E:
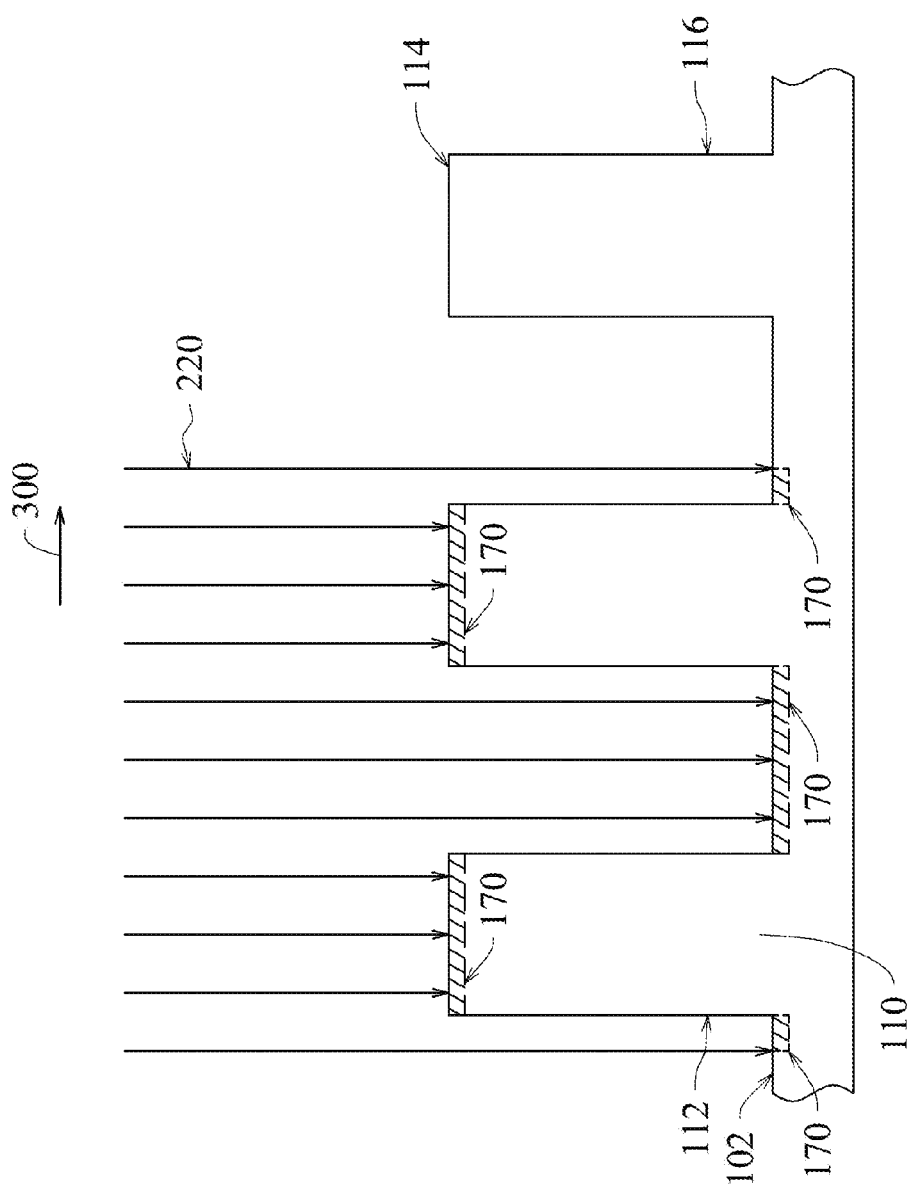
Figure 2F:
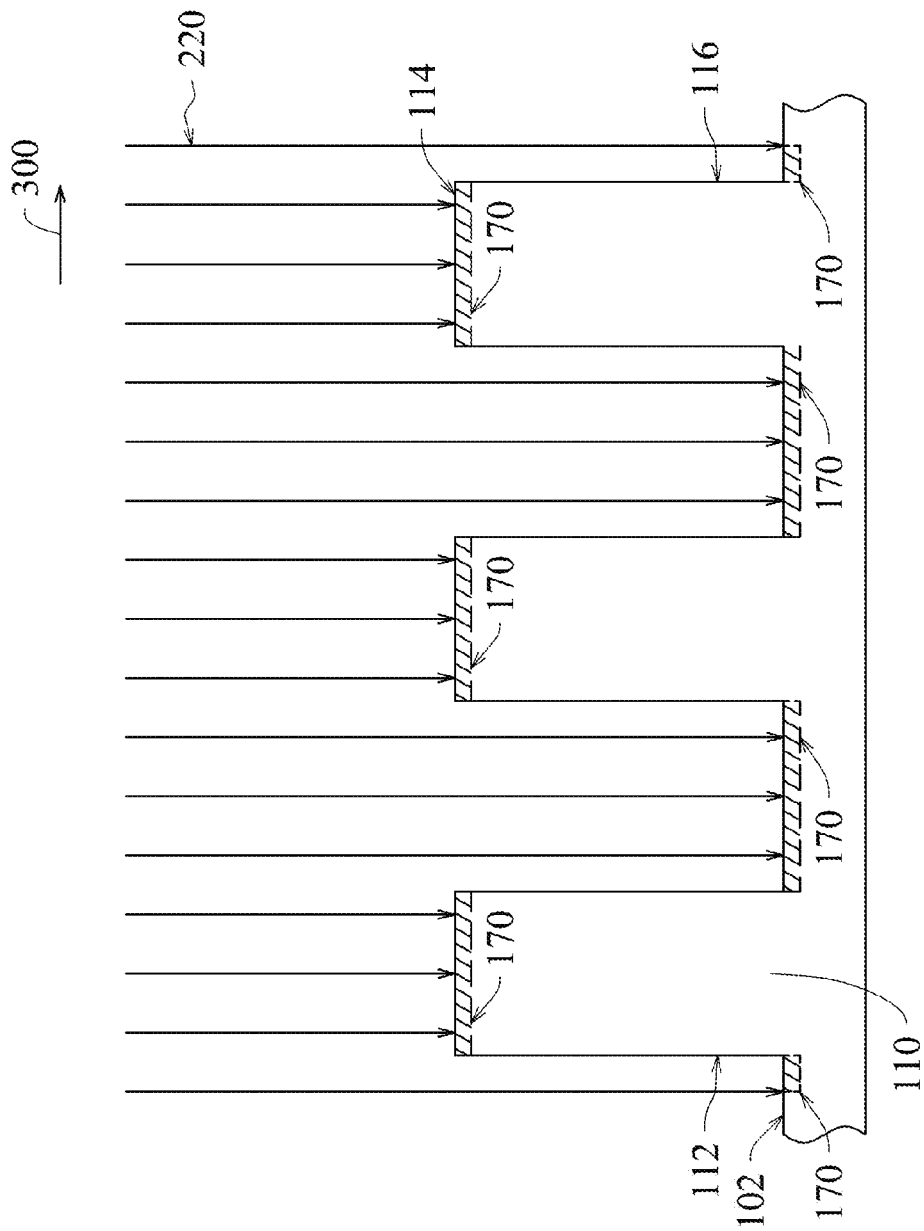
Figure 2G:
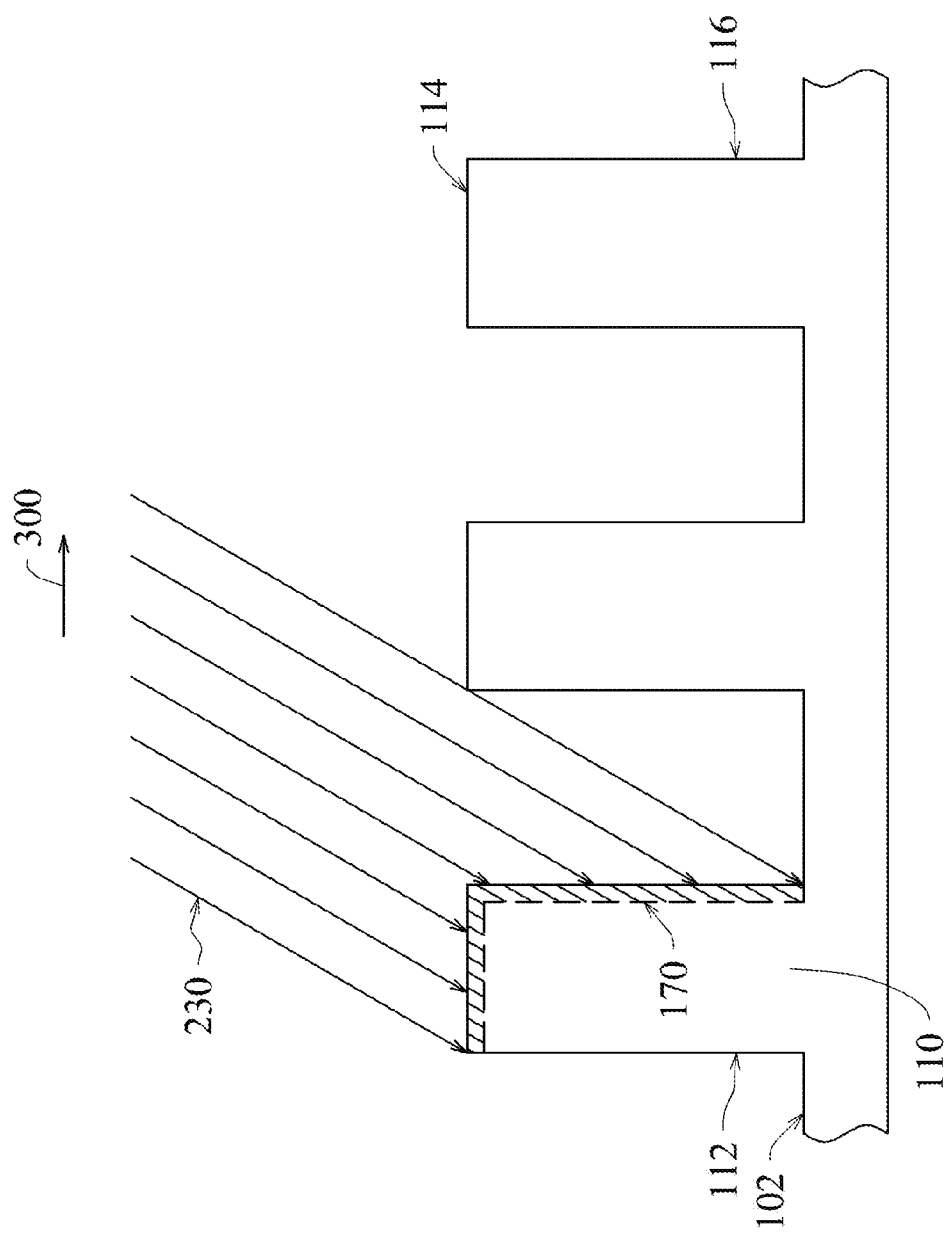
Figure 2H:
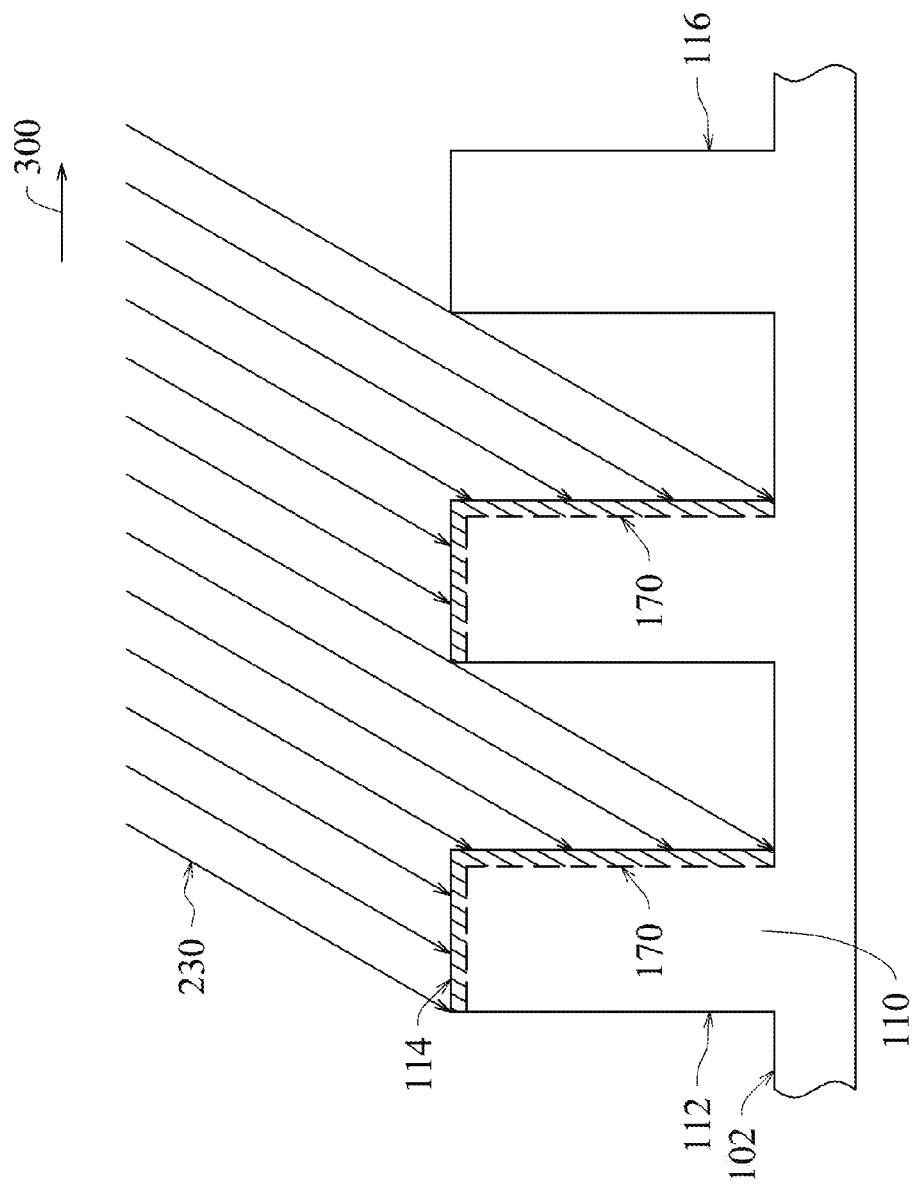
Figure 2I:
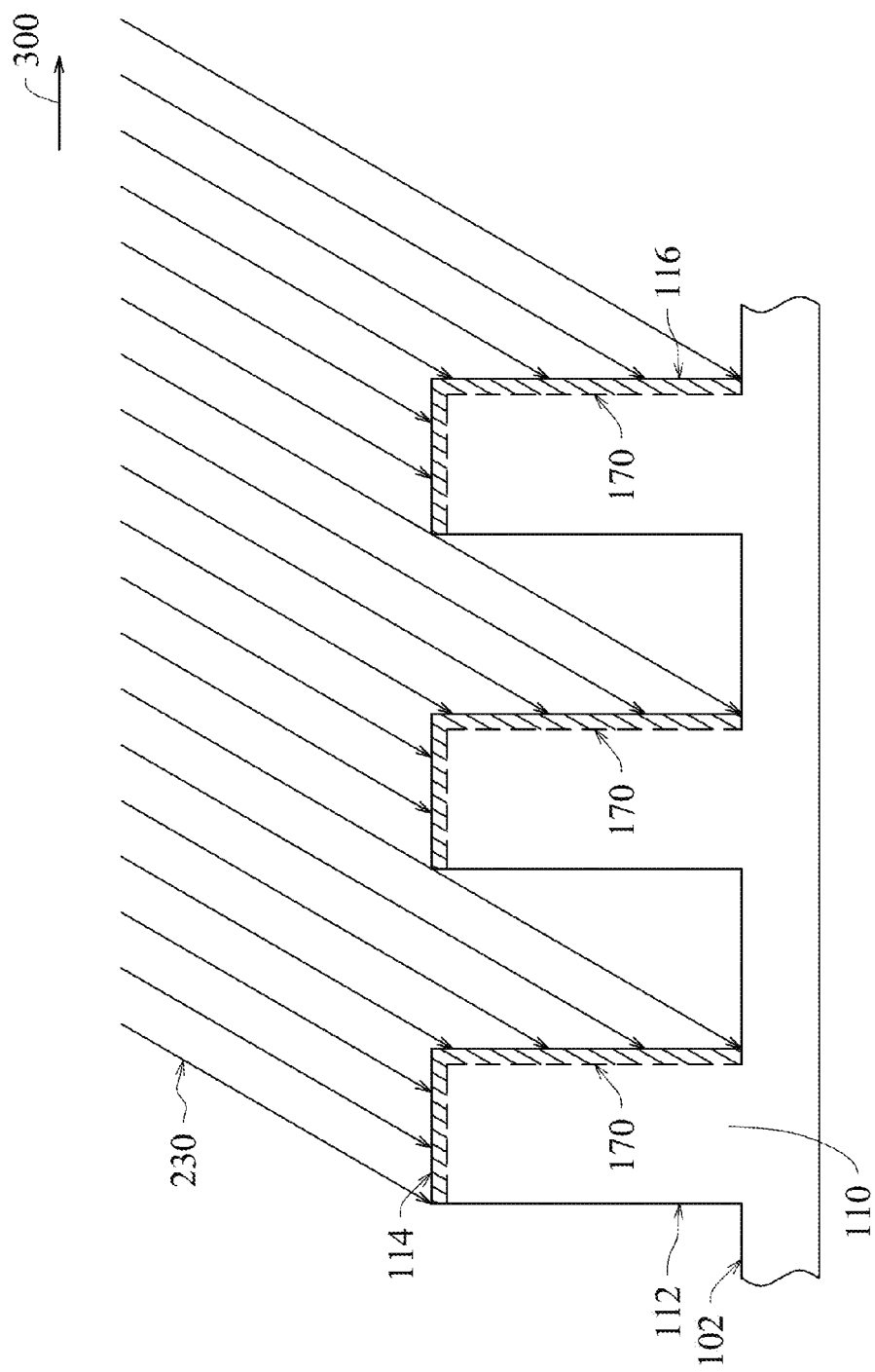

In detail, referring to the embodiment shown in FIGS. 5a-5e, the non-parallel ion beam 400 is a divergent ion beam and used for scanning a workpiece with numerous FinFETs 100 as illustrated in FIG. 1. To simply the drawings and the description, FIGS. 5a-5e only illustrate a workpiece having an upper surface 102 and three fins formed on the upper surface 102, wherein each one of the fins 110 has a left side surface 112, a top surface 114 and a right side surface 116. Of course, at least the practical number of the fins, the height and the width and the fins, the distance between neighboring fins and the incident angles of the non-parallel ion beam are not limited, they are just examples in FIGS. 5a-5e. In the present embodiment, the non-parallel ion beam 400 scans the workpiece along a direction 300, for example but not limited to, by linearly driving the workpiece having FinFET 100 to move across the non-parallel ion beam 400. Herein, the direction 300 crosses all of the left side surface 112, the top surface 114 and the right side surface 116. Further, when the non-parallel ion beam 400 is a divergent ion beam, along the direction 300, the non-parallel ion beam 400 can be viewed as a combination of numerous parallel ion beams, wherein the incident angle of these parallel ion beams vary from the incident direction 230 to the incident direction 210, wherein the incident directions 230/210 are shown in FIGS. 2a to 2c. Indeed, this is why a divergent ion beam may be viewed as an integrated divergent beam (IDB).

Figure 5A:
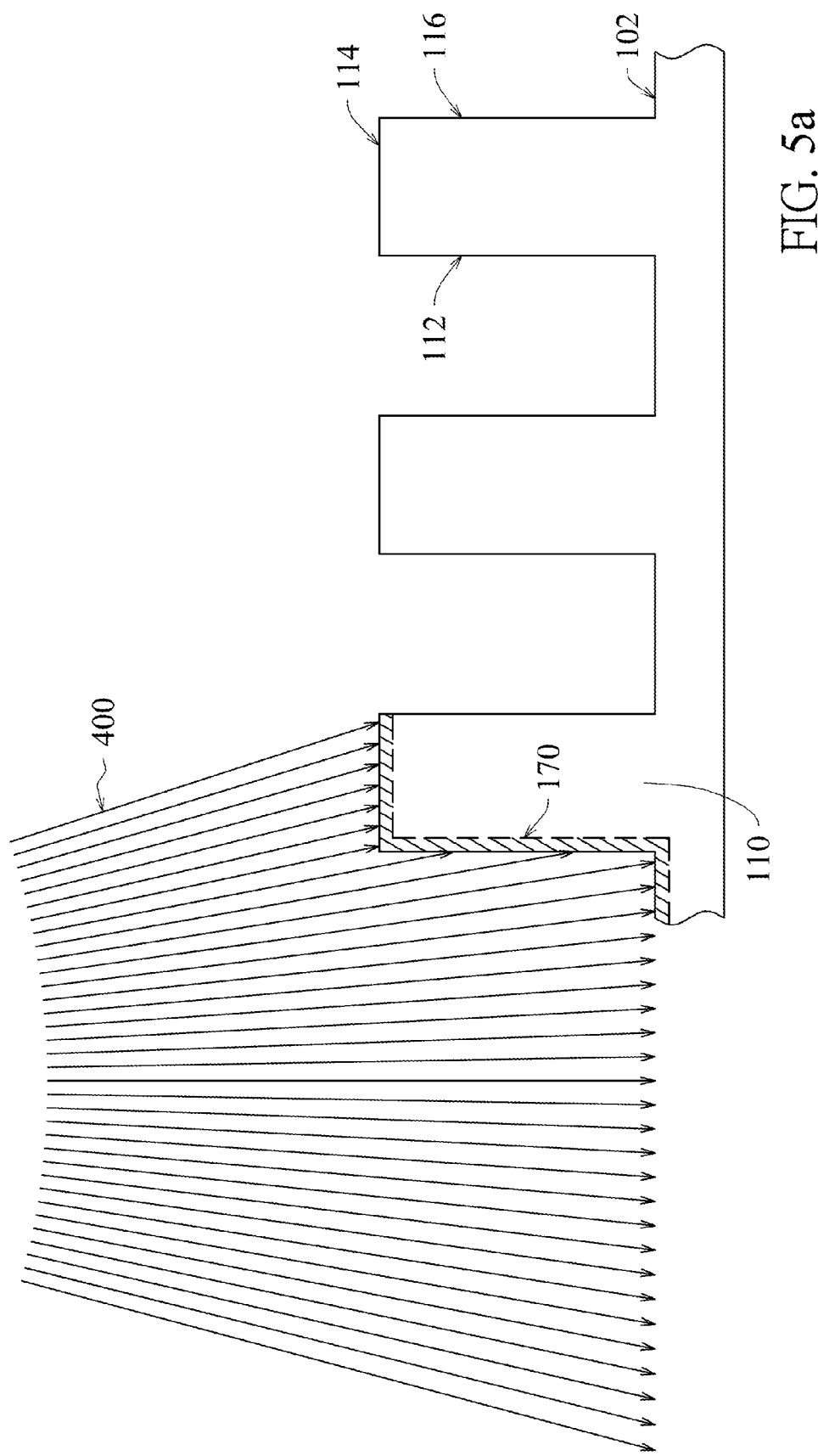
Figure 5B:
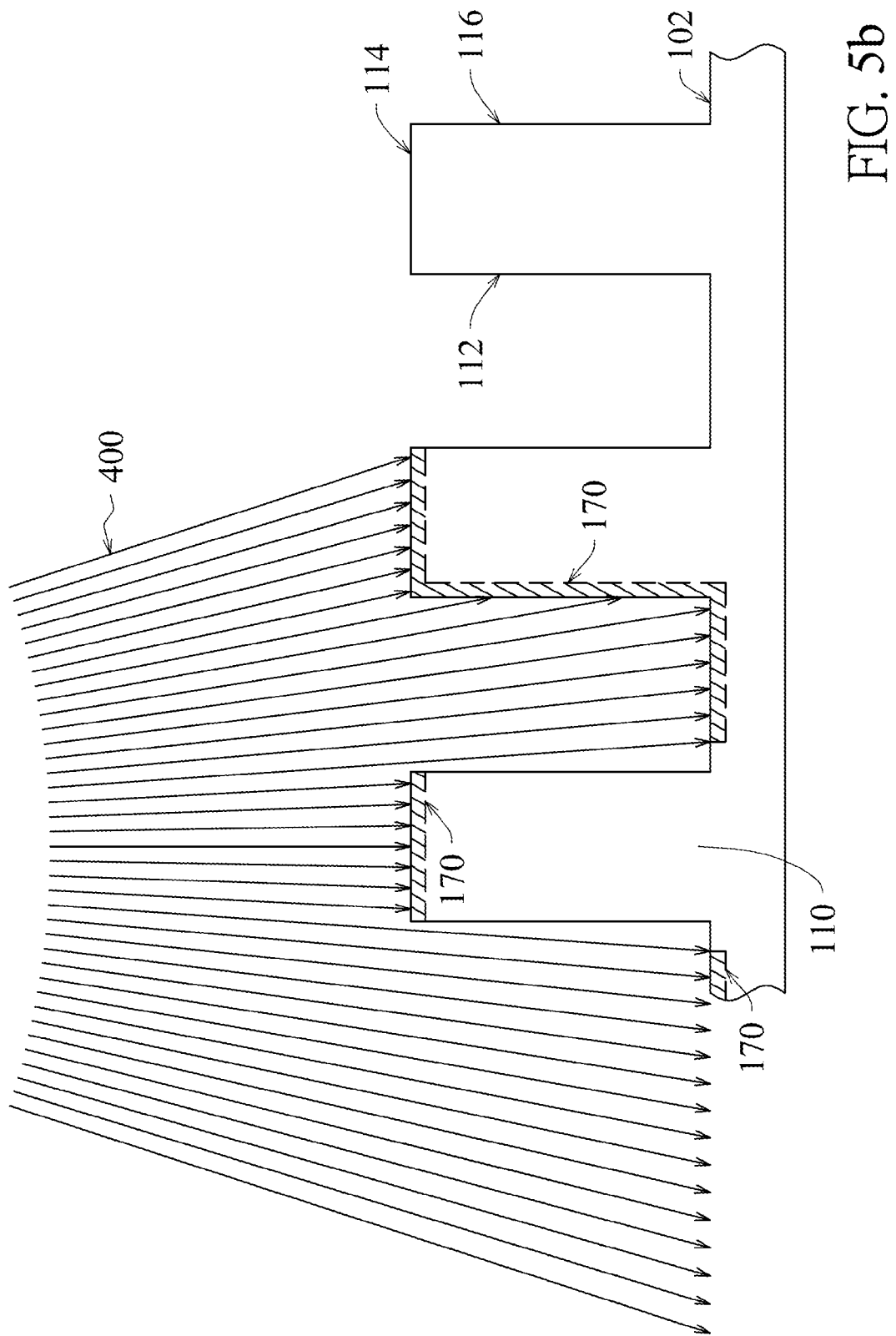
Figure 5C:
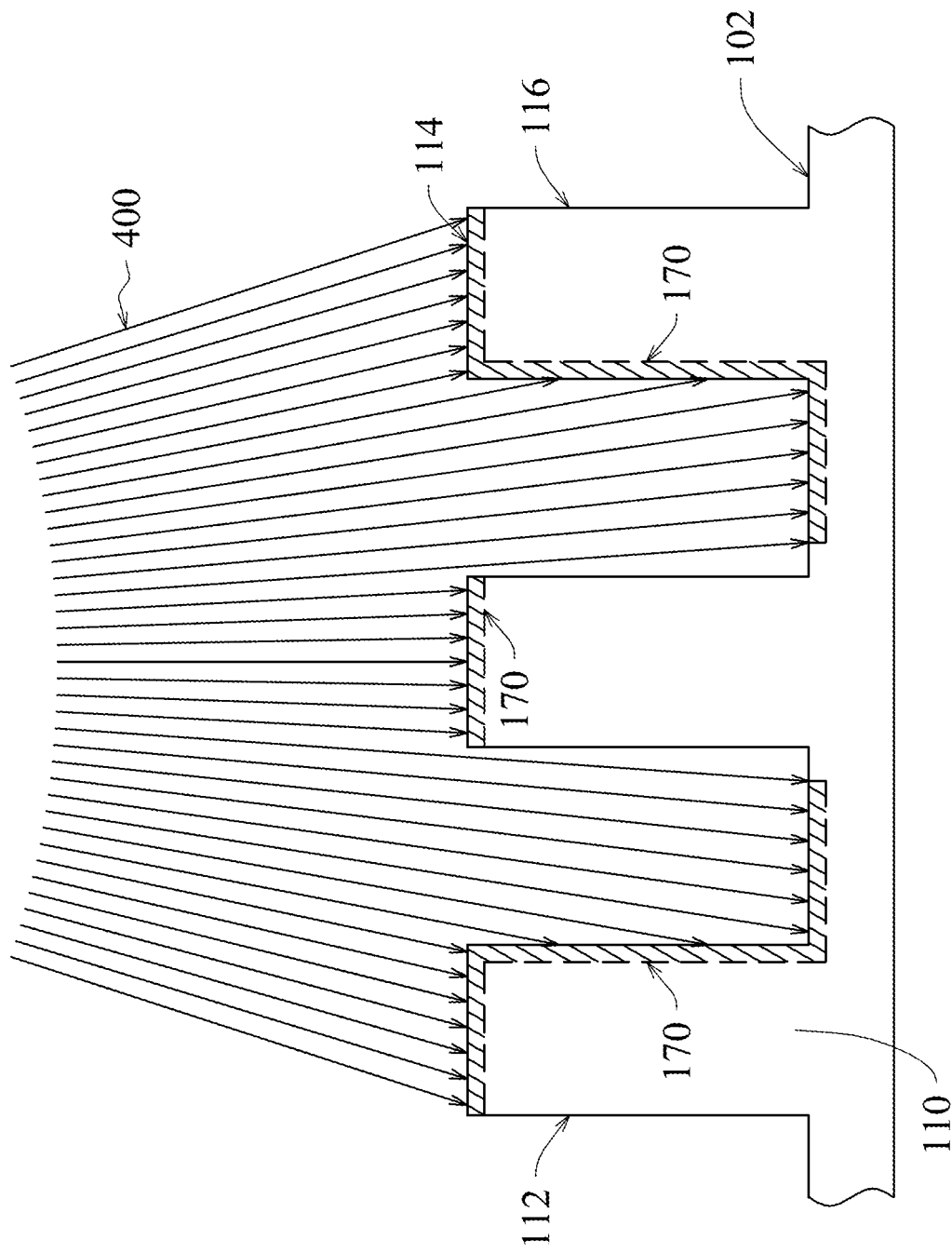
Figure 5D:
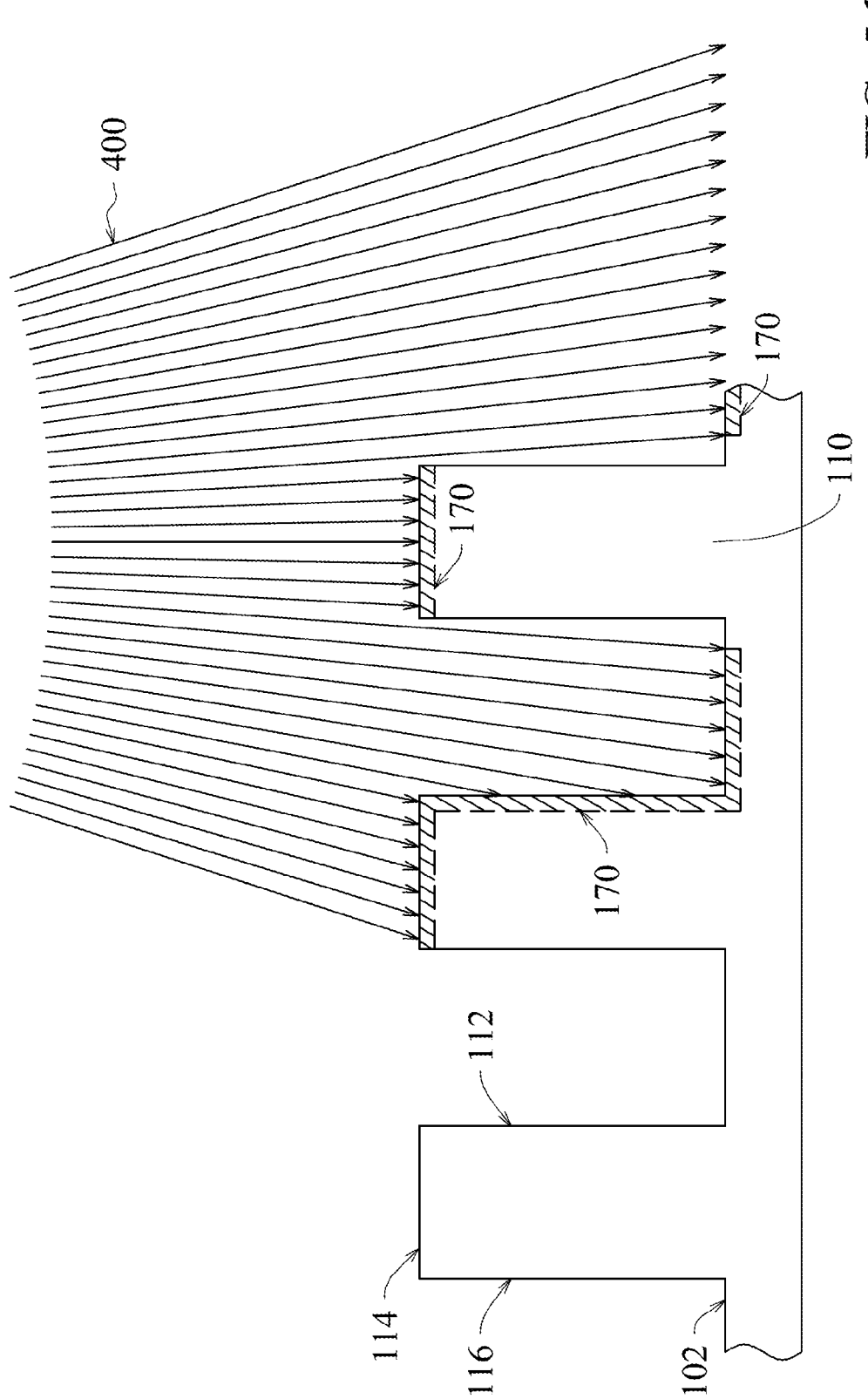
Figure 5E:
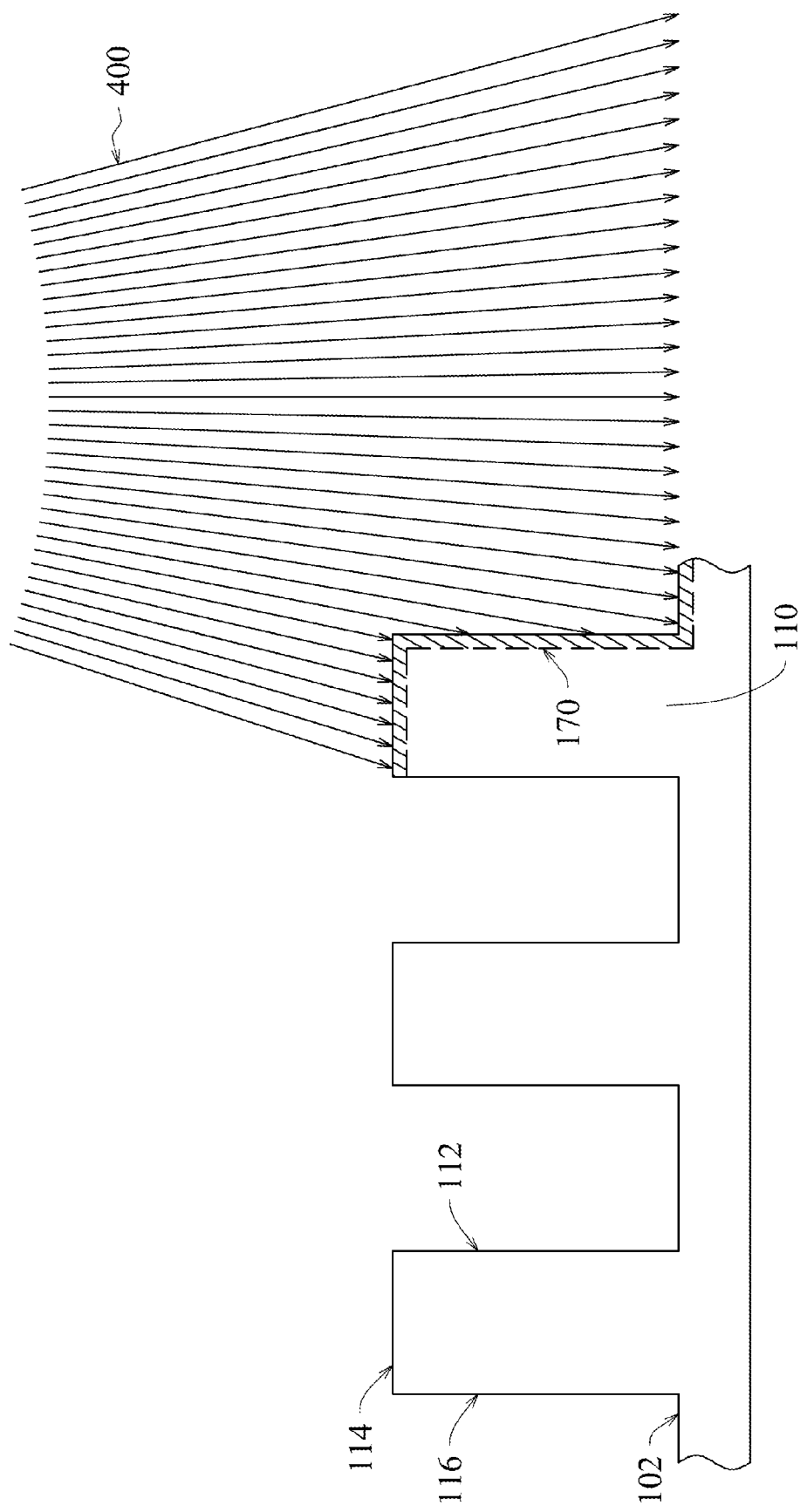

In a word, at a first moment as shown in FIG. 5a, the non-parallel ion beam 400 merely implants a left part of the upper surface 102 and both of the left side surface 112 and the top surface 114 of the left fin 110. Next, at a second moment as shown in FIG. 5b, the non-parallel ion beam 400 implants most of the left two parts of the upper surface 102, the top surface 114 of the left fin 110 and both of the left side surface 112 and the top surface 114 of the middle fin 110. But, because the right-half portion of the non-parallel ion beam 400 has the incident direction from the left-top to the right-down, a small portion of the left second part of the upper surface 102 closed to the left fin 110 still is not implanted. Thereafter, at a third moment as shown in FIG. 5c, the non-parallel ion beam 400 implants most of the middle two parts of the upper surface 102, both of the top surface 114 and the right side surface 116 of the left fin 110 and both of the left side surface 112 and the top surface 114 of the right fin 110. Note that the left part of the upper surface 102 is totally implanted now due to it had been implanted by both the right-half portion of the non-parallel ion beam 400 and most of the left-half portion of the non-parallel ion beam 400. But, due to the same reason, a small portion of the left third part of the upper surface 102 closed to the middle fin 110 still is not implanted. Afterward, at a fourth moment as shown in FIG. 5d, the non-parallel ion beam 400 implants most of the right two parts of the upper surface 102, both of the top surface 114 and the right side surface 116 of the middle fin 110 and the top surface 114 of the right fin 110. Again, due to the same reason, a small portion of the right first part of the upper surface 102 closed to the right fin 110 still is not implanted. Then, at a fifth moment as shown in FIG. 5e, the non-parallel ion beam 400 merely implants a right part of the upper surface 102 and both of the top surface 114 and the right side surface 116 of the right fin 110. Note that all top surfaces 102 and all surfaces 112/114/116 of all fin structures 110 are implanted after each of them are scanned by all portions of the non-parallel ion beam 400 in sequence.

In another embodiment, referring to FIGS. 6a-6e, the non-parallel ion beam 400 is a convergent ion beam instead. Similarly, the non-parallel ion beam 400 scans the workpiece along the direction 300, for example but not limited to, by linearly driving the workpiece to move across the non-parallel ion beam 400. In contrast to the embodiment as shown in FIGS. 5a-5e, when the non-parallel ion beam 400 is a convergent ion beam, along the direction 300, the non-parallel ion beam 400 can be viewed as a combination of numerous parallel ion beams, wherein the incident angle of these parallel ion beams vary from the incident direction 210 to the incident direction 230, wherein the incident directions 210/230 are shown in FIGS. 2a to 2c. Indeed, this is why a convergent ion beam may be viewed as an integrated divergent beam (IDB). Similarly, to simply the drawings and the description, FIGS. 6a-6e only illustrate a workpiece having an upper surface 102 and three fins formed on the upper surface 102, wherein each one of the fins 110 has a left side surface 112, a top surface 114 and a right side surface 116. Of course, at least the practical number of the fins, the height and the width and the fins, the distance between neighboring fins and the incident angles of the non-parallel ion beam are not limited, they are just examples in FIGS. 6a-6e.

Figure 6B:
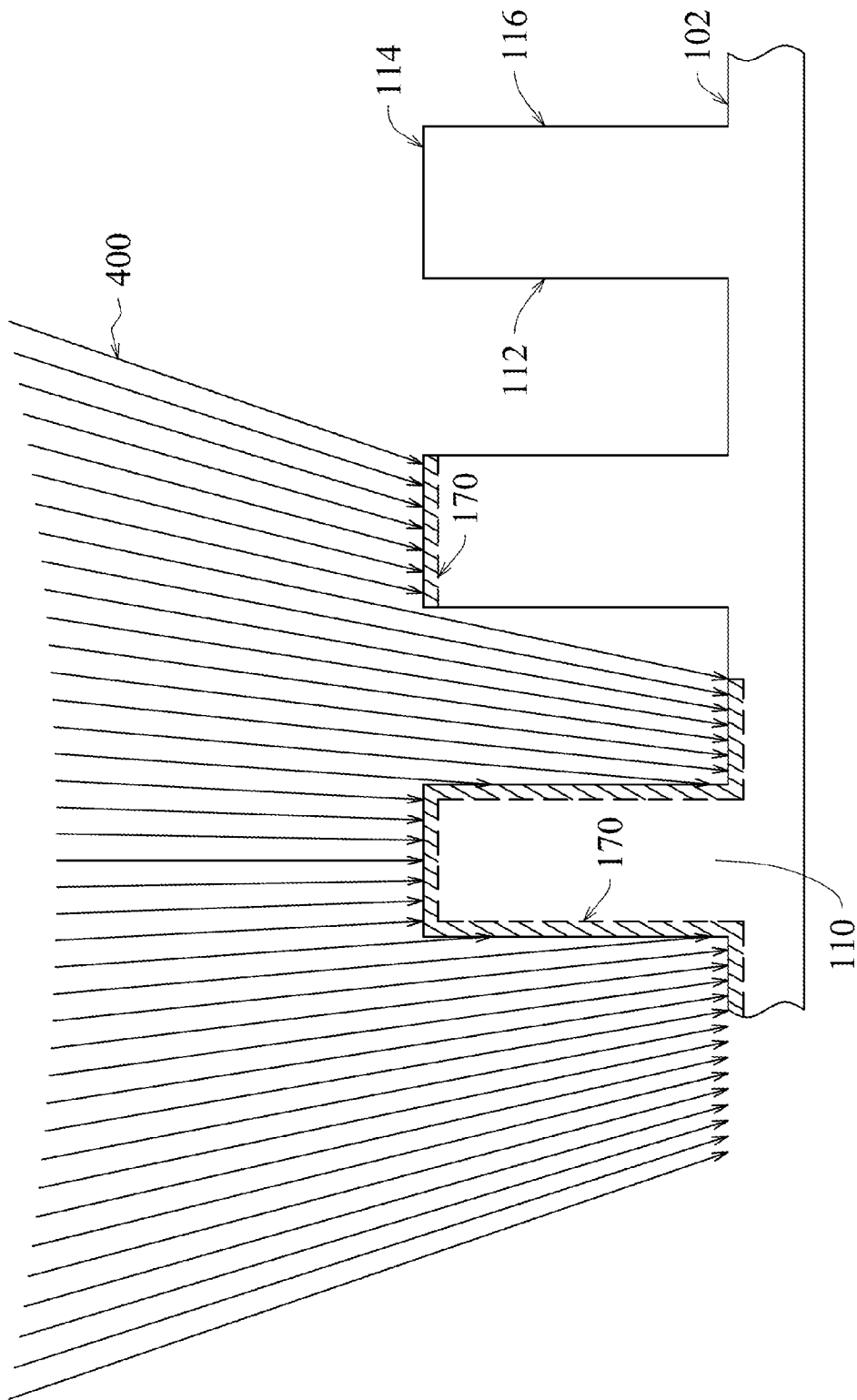
Figure 6C:
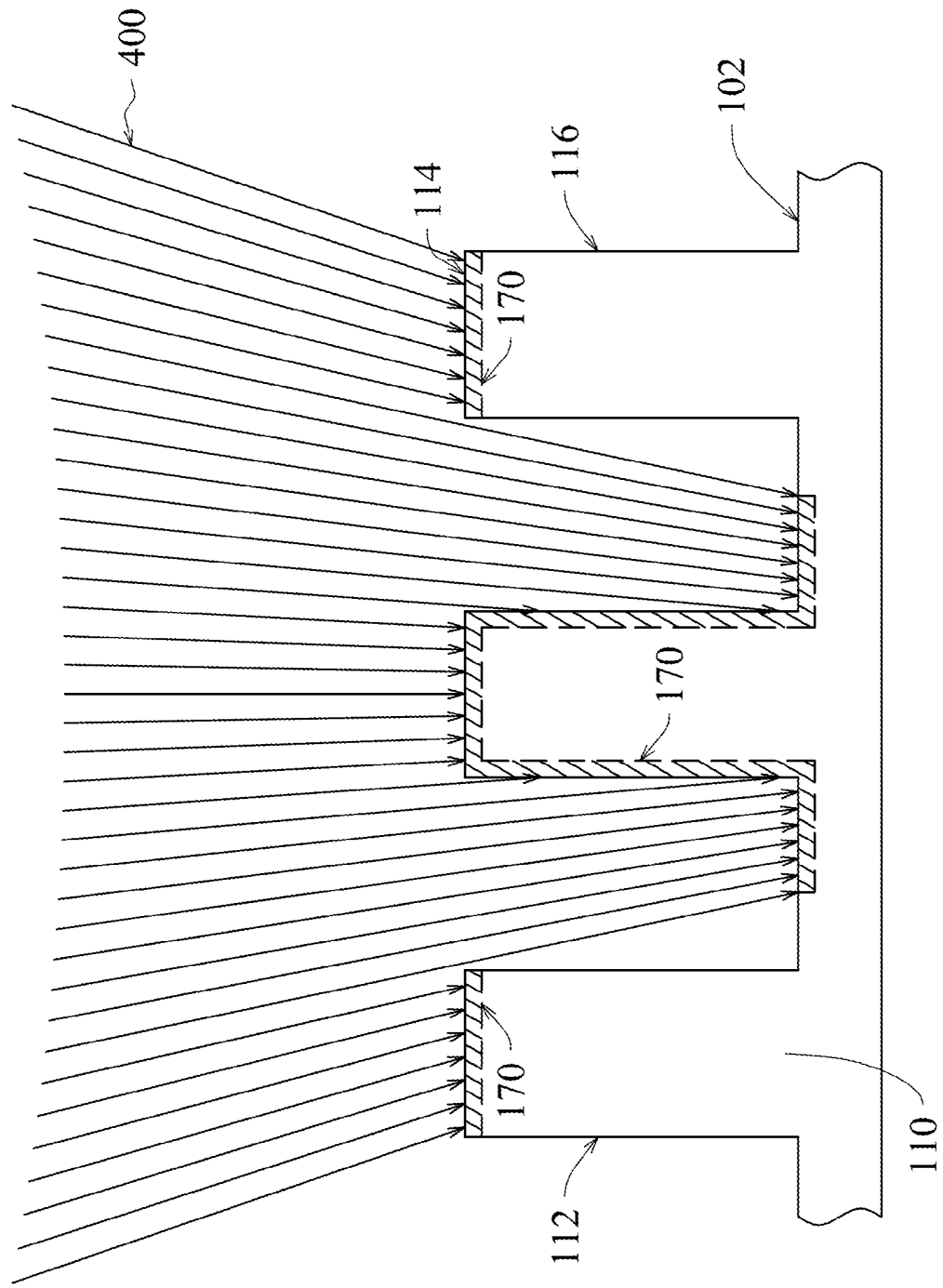
Figure 6D:
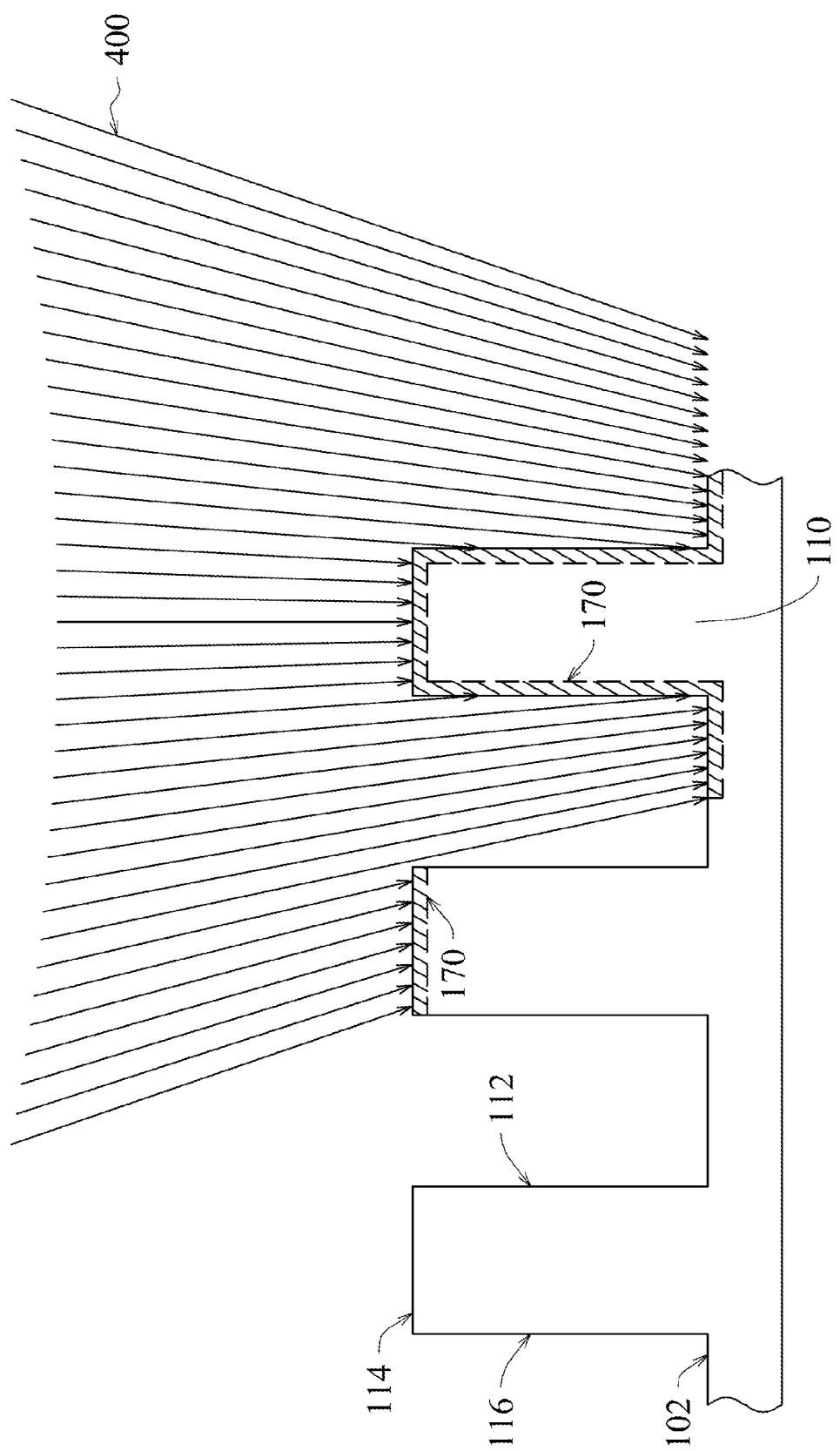
Figure 6E:
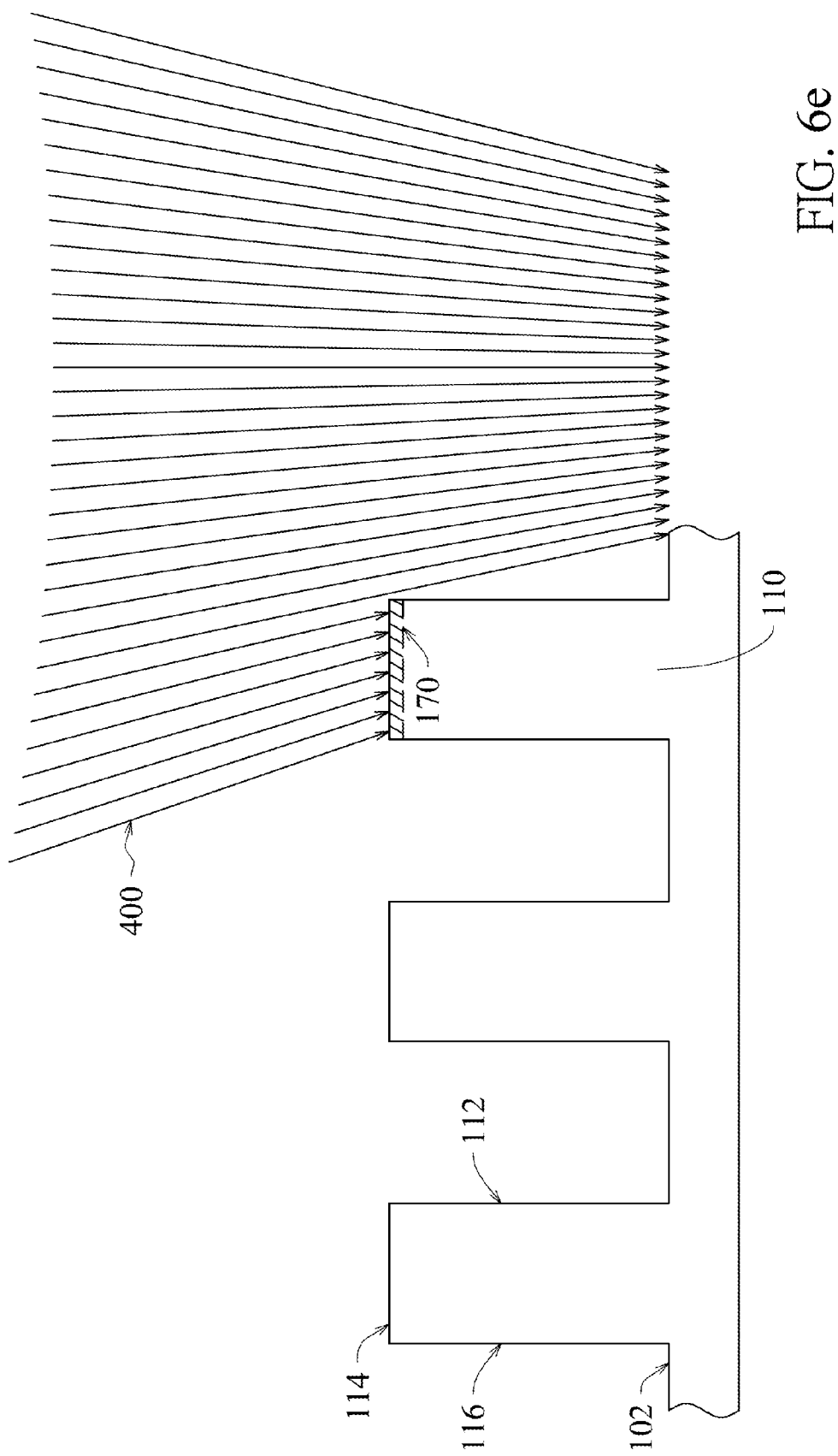

In details, at a first moment as shown in FIG. 6a, the non-parallel ion beam 400 implants the top surface 114 of the left fin 110 only. Next, at a second moment as shown in FIG. 6b, the non-parallel ion beam 400 implants most of the left two parts of the upper surface 102, all of the left side surface 112, the top surface 114 and the right side surface 116 of the left fin 110 and the top surface 114 of the middle fin 110. But, because the right-half portion of the non-parallel ion beam 400 has the incident direction from the right-top to the left-down, a small portion of the left second part of the upper surface 102 closed to the middle fin 110 still is not implanted. Thereafter, at a third moment as shown in FIG. 6c, the non-parallel ion beam 400 implants most of the middle two parts of the upper surface 102, the top surfaces 114 of the left and the right fins 110 and all of the left side surface 112, the top surface 114 and the right side surface 116 of the middle fin 110. Again, due to the same reason, a small portion of a part of the upper surface 102 positioned between the middle fin 110 and the right fin 110 and positioned closed to the right fin 110 still is not implanted. Afterward, at a fourth moment as shown in FIG. 6d, the non-parallel ion beam 400 implants the right two parts of the upper surface 102, the top surface 114 of the middle fin 110 and all of the left side surface 112, the top surface 114 and the right side surface 116 of the right fin 110. Herein, for those portions of the top surface 110 positioned two neighboring fin structures 112, after being implanted by both the right-half portion and the left-half portion of the convergent non-parallel ion beam 400, those portions are fully implanted. Then, at a fifth moment as shown in FIG. 6e, the non-parallel ion beam 400 implants the top surface 114 of the right fin 110 only. Note that all top surfaces 102 and all surfaces 112/114/116 of all fin structures 110 are implanted after each of them are scanned by all portions of the non-parallel ion beam 400 in sequence.

In additional, from FIG. 5a to FIG. 6e, the regions marked by the slash on the surfaces of the upper surfaces 102 of the workpiece and the left/top/right surfaces 112/114/116 of the fins are the doped region, i.e., the sources and the drains of the FinFETs. Herein, to simply the drawings and the discussions, the variation of the dopant concentration, the thickness, the uniformity and other properties of the doped region during the process of scanning the workpiece across the non-parallel ion beam 400 is omitted. Herein, on the above paragraphs, the drawings and the discussions are focused on how the doped regions are formed by using the non-parallel ion beam to replace the usage of the conventional parallel ion beam. Furthermore, the FinFET is just an example of the three-dimensional structures positioned on the upper surface of the workpiece, when the previous discussions only emphasize the three-dimensional characteristics of the fins 110 and the problems induced by such three-dimensional characteristics.

Accordingly, by using a divergent ion beam or a convergent ion beam as the non-parallel ion beam 400, it is possible to implant various regions of the FinFET 100 during one and only one scan as long as the parameters of the non-parallel ion beam, such as the ion beam current distribution, ion beam voltage, ion beam cross-section shape and so on, can be sufficiently controlled even fixed during the scanning period. The term "one and only one scan" means using a non-uniform ion beam to scan a workpiece along a scan route one and only one time, i.e., have a relative motion between the non-uniform ion beam and the workpiece along a pre-determined path one and only one time. In contrast, as discussed above, by using a conventional parallel ion beam 200 as shown in FIGS. 2a-2i, it is necessary to implant various regions of the FinFET 100 by scanning the FinFET 100 several times with different incident directions, i.e., repeatedly have a relative motion between the non-uniform ion beam and the workpiece along a pre-determined path several times. Therefore, the total time spent on the implantation procedure for implanting the FinFET 100 by using a non-parallel ion beam 400 is significantly shorter than that by using the conventional parallel ion beam 200. Besides, in other non-illustrated embodiments, the non-parallel ion beam can scan the workpiece (i.e. the FinFET 100 as described above) by tilting the workpiece relative to a transmission path of the non-parallel ion beam, because the key is changing the relative geometric relation between the non-parallel ion beam the fin structures to be implanted.

Furthermore, although the above embodiments implant the IDB perpendicularly for forming the FinFET 100, other non-illustrated embodiments may implant the IDB at a tilt angle. Herein, for example, an IDB implanted at a zero tilt angle means that the tilt angle of different portions of an IDB is varied from −15 degrees to 15 degrees in sequence, and an IDB implanted at a tilt angle of 5 degrees means that the tilt angle of different portions of an IDB is varied from −10 degrees to 20 degrees in sequence. Although not particularly illustrated, it is reasonable that different tilt angle may have different implantation result on the fin structure 110, especially on the sidewall of the fin structure 110. The degree of the tilt angle is a flexible and adjustable parameter of an implantation using the IDB and the practical tile angle may be tuned according to but not limited to the following items: the height of the fin structure 110, the width of the fin structure, the shape of the fin structure, the profile of the sidewall of the fin structure 110, the distance between the neighboring fin structures 110, the ion beam current distribution of the IDB, the ion beam energy of the IDB, and so on.

Figure 7C:
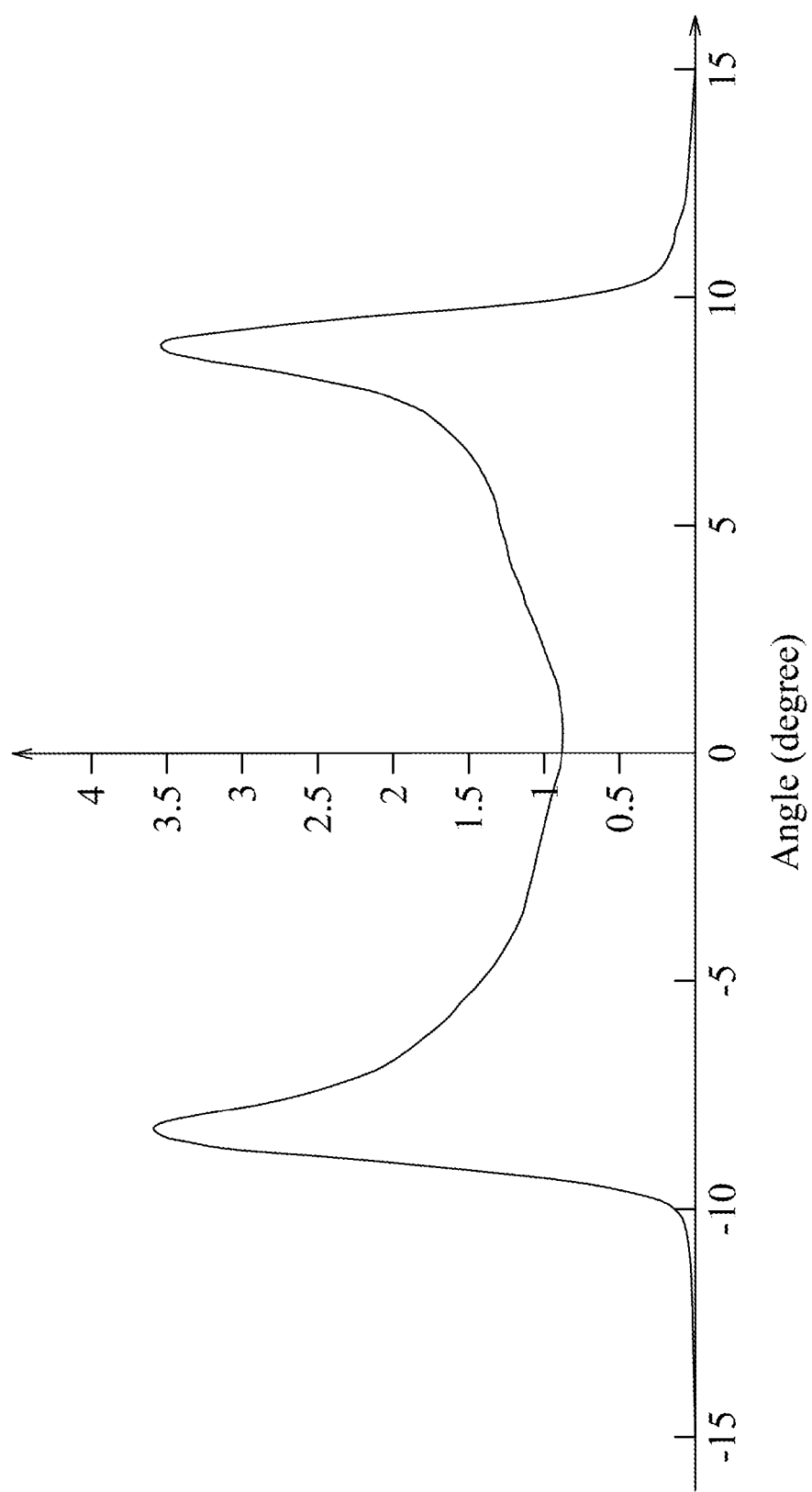
FIG. 7c illustrates a beam current distribution in angle of the IDB converted from FIG. 7b.
Figure 8A:
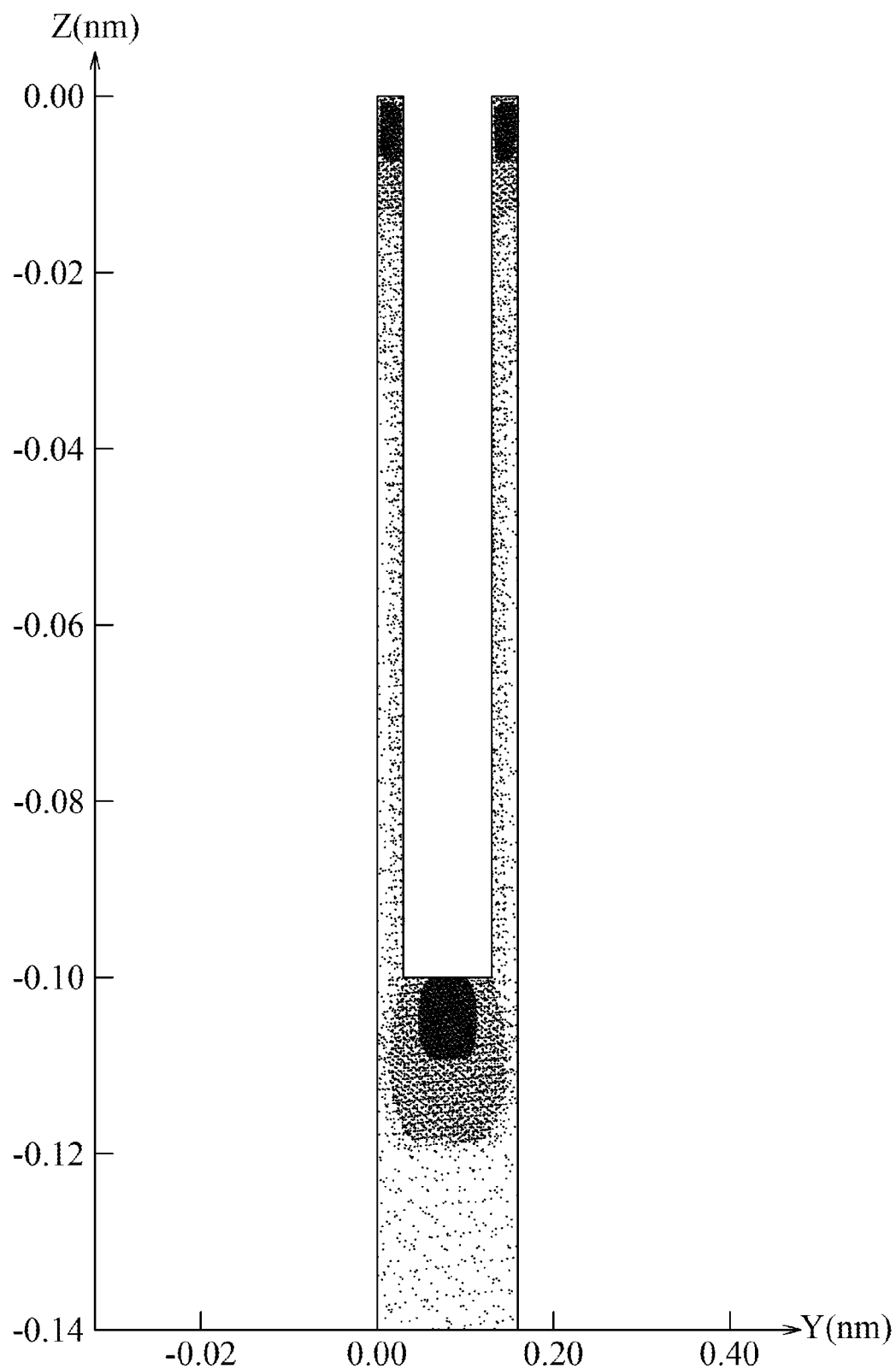
FIG. 8a illustrates an implantation result of a rectangular fin simulated by using a parallel spot beam.
Figure 8B:
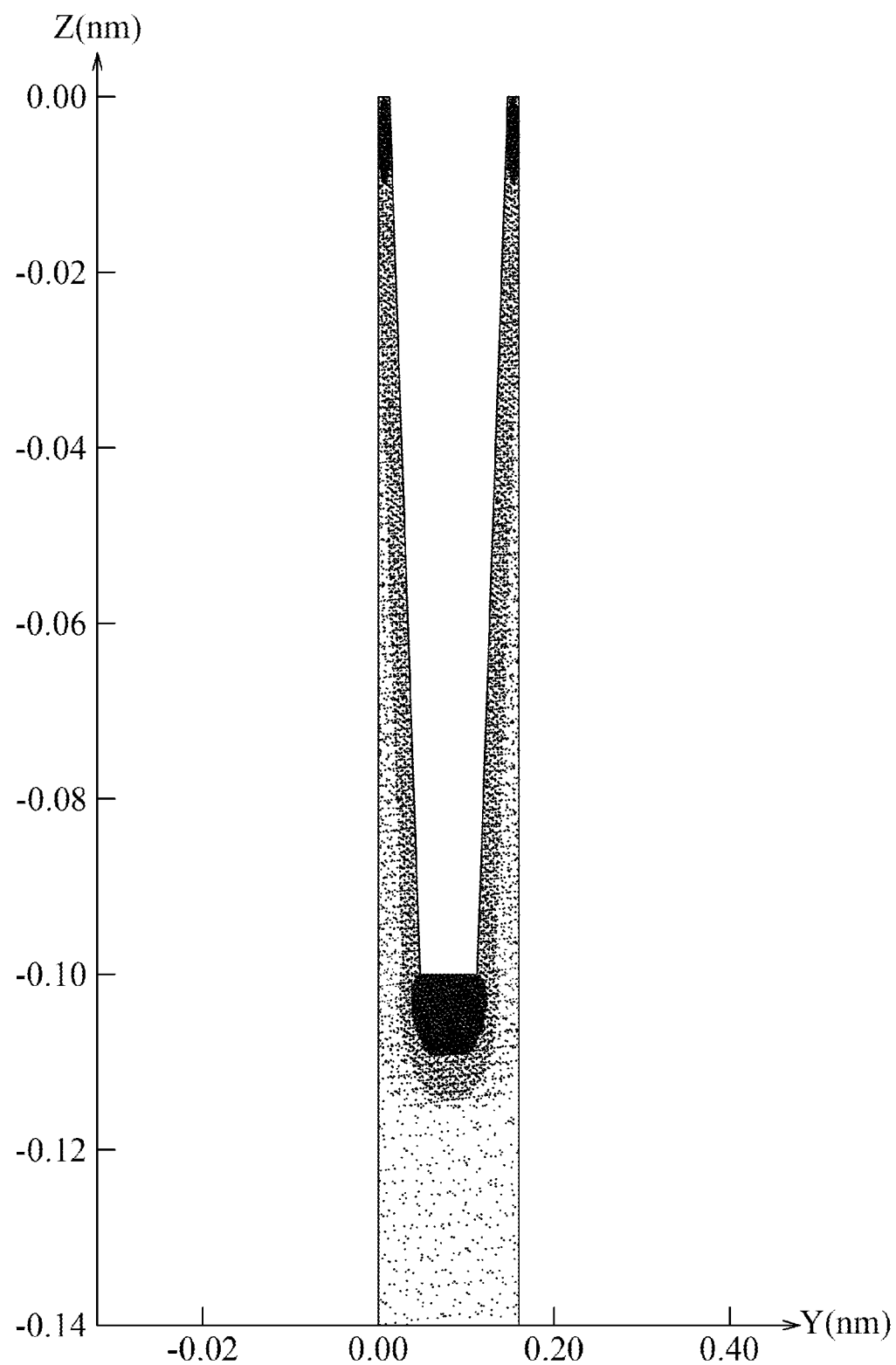
FIG. 8b illustrates an implantation result of a tapered fin simulated by using a parallel spot beam.
Figure 8C:
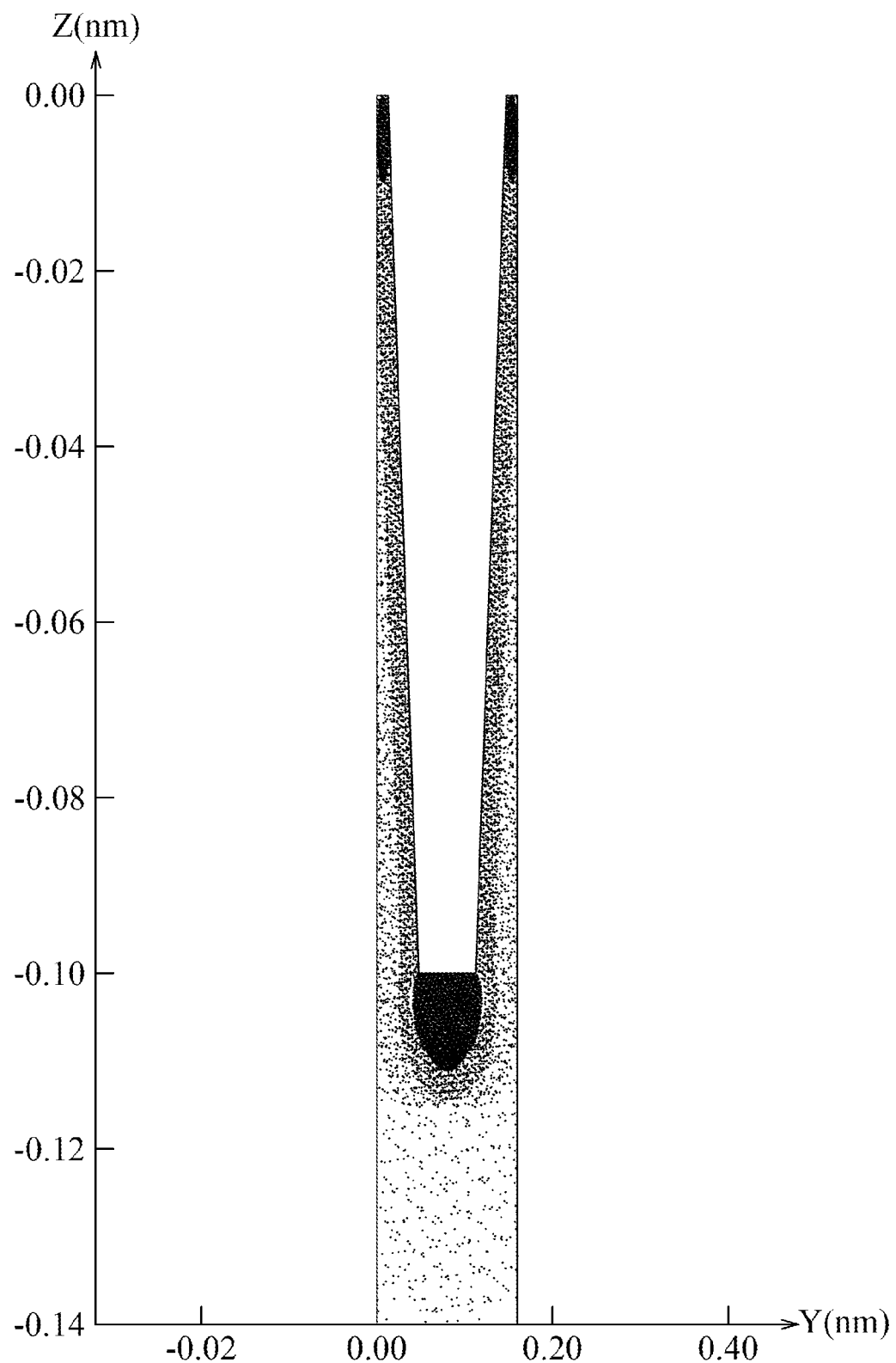
FIG. 8c illustrates an implantation result of the tapered fin as shown in FIG. 8b simulated by using an IDB.
Figure 9A:
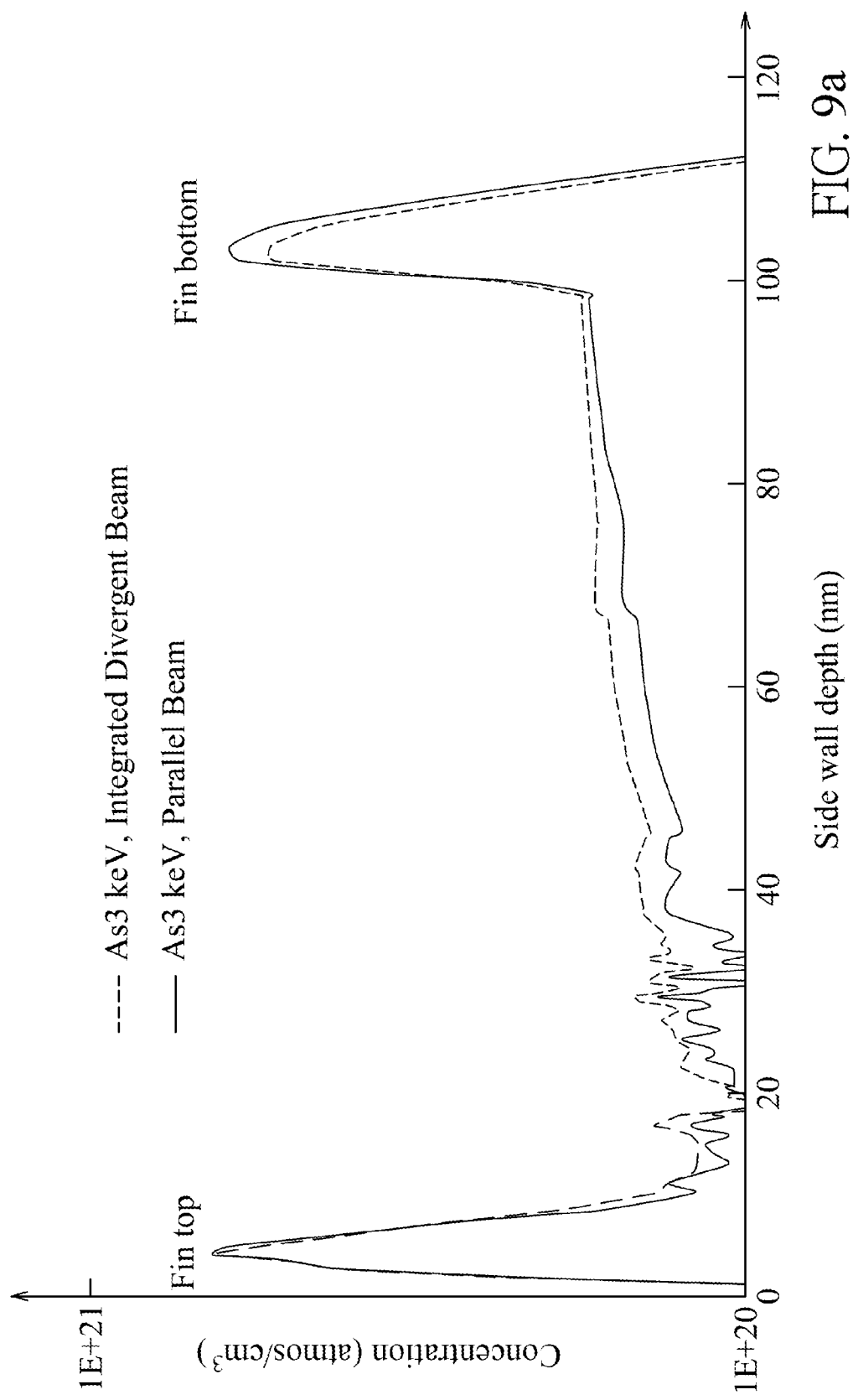
FIG. 9a to FIG. 9c show dopant profile comparisons calculated according to the implantation results as shown in FIG. 8b and FIG. 8c.
Figure 9B:
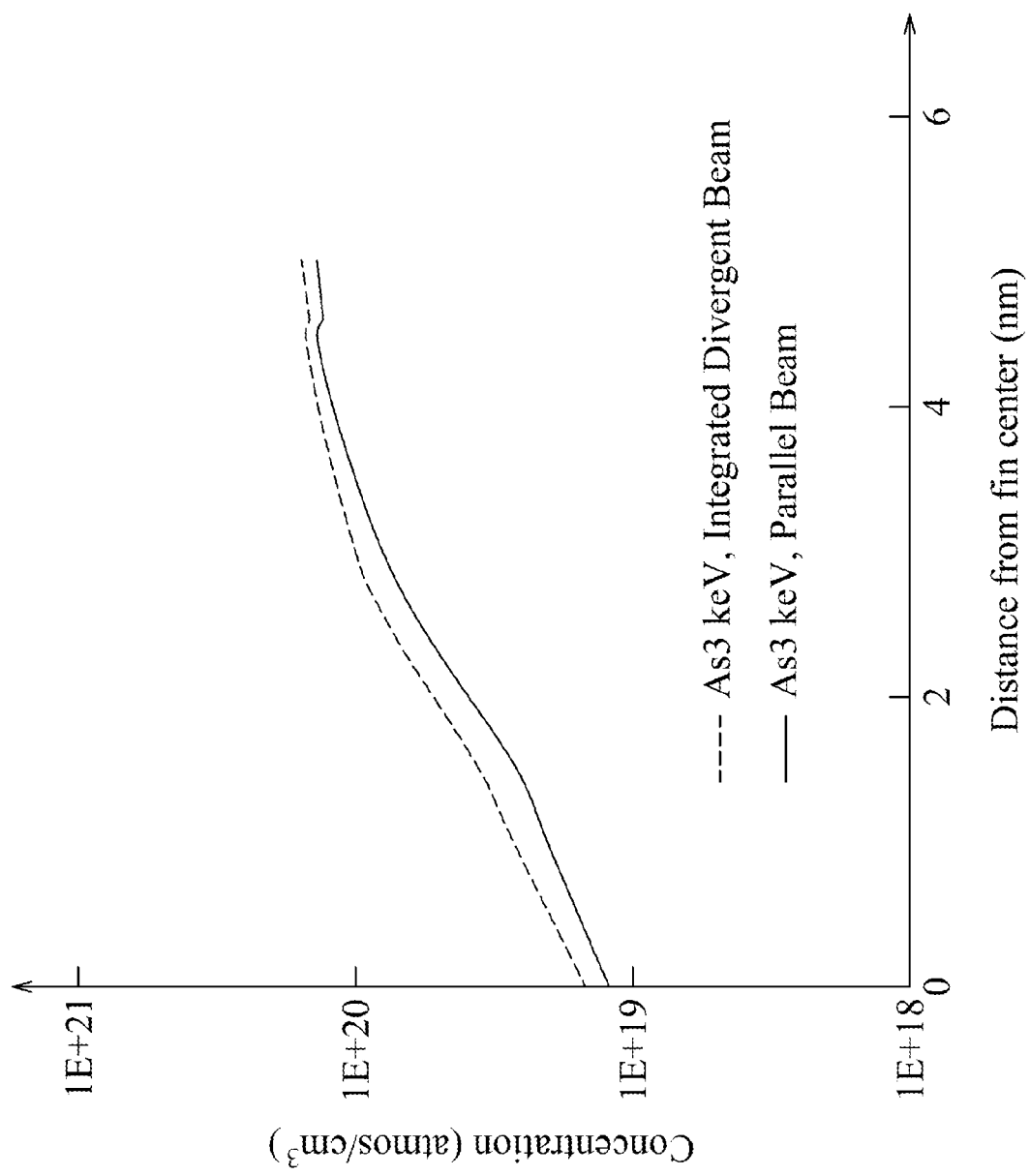
Figure 9C:
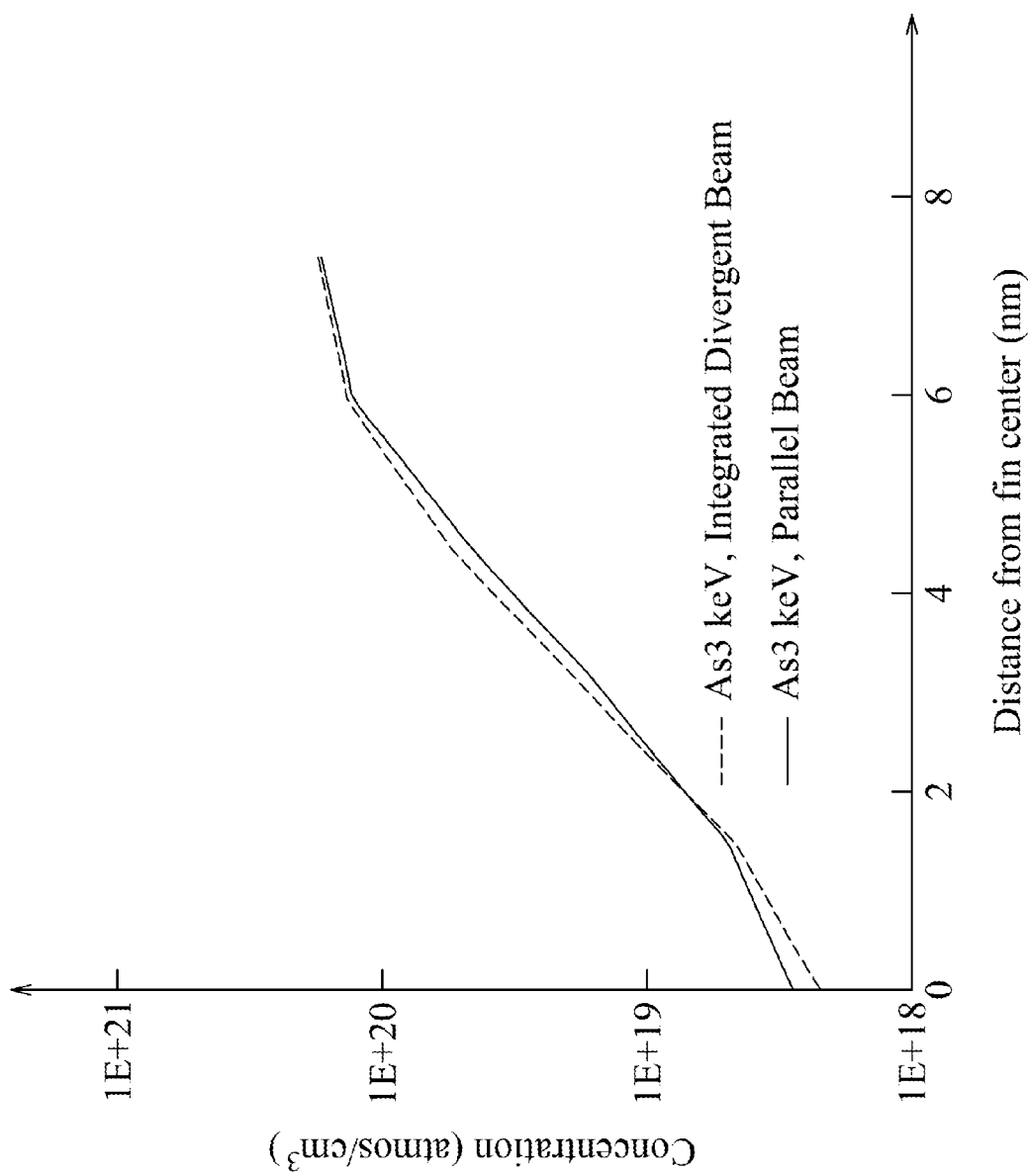
Figure 10:
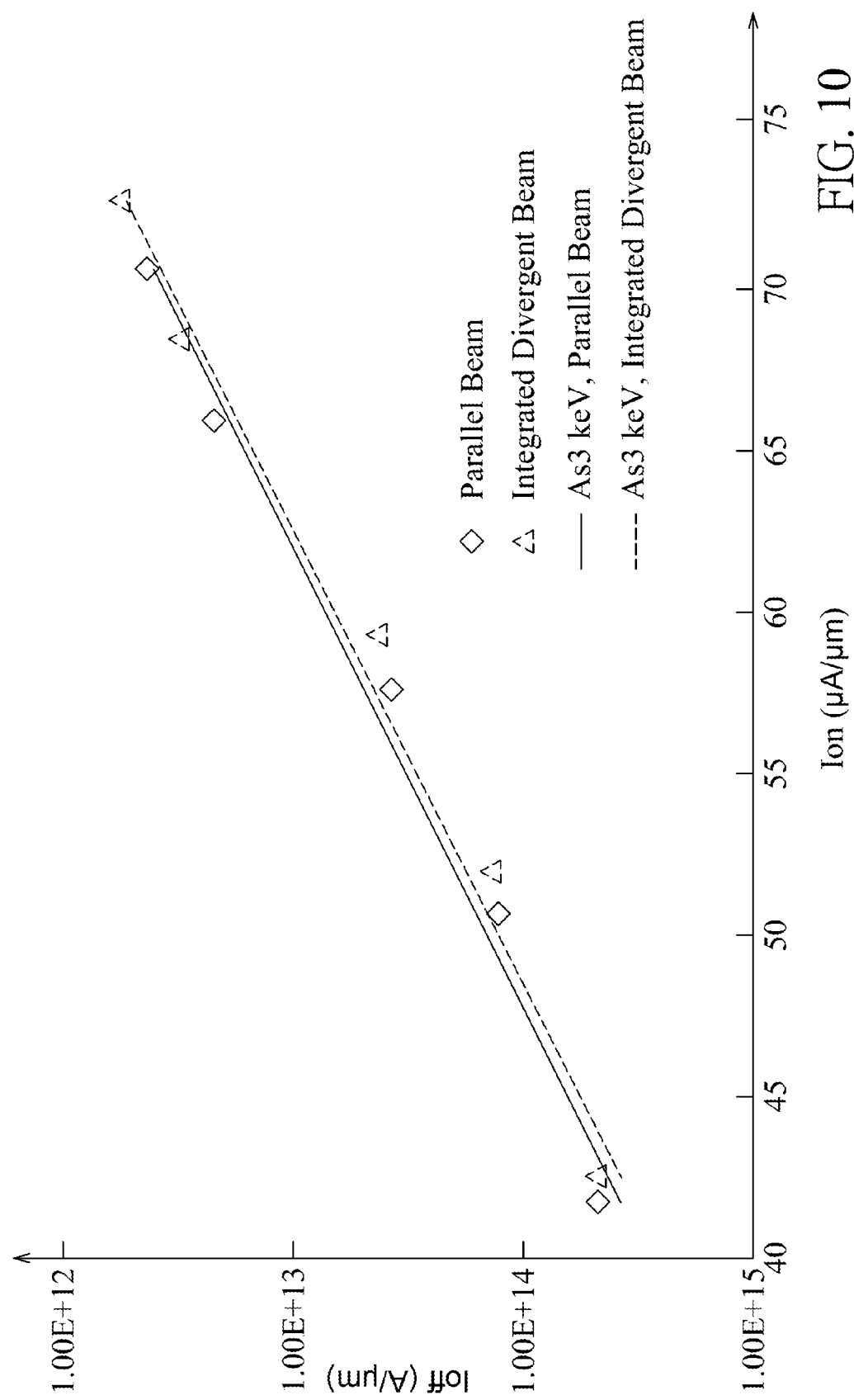
FIG. 10 shows a simulation comparison by simulating the source/drain extension of a FinFET nMOS device to be respectively implanted with the conventional parallel spot beam as shown in FIG. 7a and the IDB as shown in FIG. 7b.

FIG. 7a illustrates an exemplary beam current distribution in position of a conventional parallel spot beam, while FIG. 7b illustrates an exemplary beam current distribution in position of an integrated divergent beam (IDB) according to an embodiment of the present invention, and FIG. 7c illustrates an exemplary beam current distribution in angle of the IDB converted from FIG. 7b. Further, FIG. 8a illustrates an implantation result of a rectangular fin, while FIG. 8b illustrates an implantation result of a tapered fin, wherein both of them are Si fins with a 100 nm height and a 16 nm bottom width and simulated by a Monte-Carlo simulation with a 3 keV Arsenic parallel spot beam as shown in FIG. 7a at a tilt angle of 3 degrees. In contrast, FIG. 8c illustrates an implantation result of the tapered fin as shown in FIG. 8b simulated by another Monte-Carlo simulation with a 3 keV Arsenic IDB as shown in FIG. 7b and FIG. 7c at a tilt angle of 3 degrees. Moreover, FIG. 9a to FIG. 9c show dopant profile comparisons calculated according to the implantation results as shown in FIG. 8b and FIG. 8c, wherein FIG. 9a is calculated at 1 nm below the fin sidewall surfaces, while FIG. 9b and FIG. 9c are respectively calculated at 50 nm and 90 nm below the fin top surfaces. Besides, FIG. 10 shows a simulation comparison by simulating the source/drain extension of a FinFET nMOS device to be respectively implanted with the conventional parallel spot beam as shown in FIG. 7a and the IDB as shown in FIG. 7b.

Referring to FIG. 7a first, a beam current distribution of a conventional parallel spot beam is usually formed as a cosine shape, i.e. a beam current is decreased from a beam center to the beam edge. In contrast, referring to FIG. 7b and FIG. 7c, a beam current distribution of an IDB is usually formed as a horn shape, i.e. a beam current is increased from a beam center to the beam edge. Note that the IDB consists of various implant angles within the beam condition, and the implant angle distribution may be modified by tuning the beam shape and beam height.

According to the simulation as shown in FIG. 8a and FIG. 8b, comparing the doped results on sidewalls, it is obvious that not only the dopant concentration of a tapered fin is higher than that of a rectangular fin, but also the dopant uniformity of the tapered fin is better than that of the rectangular fin The reason at least may include both the higher incidence angle and the more ion reflection on the sidewalls occurred in the tapered fin than the rectangular fin, and that the retained dose loss of rectangular fin is obvious in sidewall surface. In other words, for the tapered fin, the implantation is less affected by the shadowing effect. Further, based on the simulation as shown in FIG. 8b and FIG. 8c, comparing the doped results on the sidewalls as well, it is found that both of the surface concentration and the dopant uniformity by using the IDB as shown in FIG. 8c is higher than those by using the conventional parallel spot beam as shown in FIG. 8b. For example, as shown in FIG. 9a, the concentration of the dopant calculated at 1 nm below the fin sidewall surfaces between about 10 nm and about 100 nm below the fin top surface is totally increased, and the difference ratio of the concentration at about 60 nm below the fin top surfaces is about 10%. Besides, the horizontal dopant profile, i.e. both of the concentrations and the uniformities of the dopant calculated at 50 nm and 90 nm below the fin top surfaces as shown in FIG. 9b and FIG. 9c, are almost all increased as well. Moreover, referring to FIG. 10, since the IDB can increase the retained dosage and better dopant uniformity, the source/drain extension of the FinFET nMOS device implanted by using the IDB as shown in FIG. 7b can have a better performance than that implanted by using the conventional parallel spot beam as shown in FIG. 7a. For example, as shown in FIG. 10, the performance $I_{on}/I_{off}$ of the IDB is about 2% higher than that of the conventional parallel spot beam.

Furthermore, according to a group of simulations as discussed above and some simulations not particularly discussed above, it is concluded that a suggested divergent angle (or s suggested convergent angle) of an IDB is usually less than 35 degrees, and preferably equal to or more than 5 degrees and equal to or less than 15 degrees. Of course, it also may be preferable equal to or more than 15 degrees or equal to or less than 25 degrees. Indeed, the preferably divergent/convergent angle usually is decided by but not limited to the below items: the height of the fin structure 110, the width of the fin structure 110, the distance between neighboring fin structures 110, the shape of the sidewall of the fin structure 110, the shape of the fin structure 110, and so on. In other words, the prefer divergent/convergent angle of the IDB is adjustable and mainly decided by the FinFET or other three-dimensional structures to be implanted by the IDB.

In summary, the method for an ion implantation disclosed in the present invention uses a non-parallel ion beam to scan a workpiece, especially a workpiece having three-dimensional structures positioned on its upper surface, so as to enable each region of the workpiece to be implanted by different portions of the non-parallel ion beam, especially all surfaces of the three-dimensional structures. As a result, it is possible to significantly shorten the total time spent on the implantation procedure for implanting a three-dimensional structure by using the non-parallel ion beam than using the conventional parallel ion beam. In additional, when the three-dimensional structure to be implanted is a tapered fin or a structure having a sidewall tilted to the top surface of the workpiece, the implantation on the three-dimensional structure, especially on the sidewall(s) of the three-dimensional structure, ma have higher dopant concentration and higher uniformity by using the IDB, no matter the IDB is a divergent ion beam or a convergent ion beam.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method for an ion implantation, comprising:
    providing a non-parallel ion beam; and
    generating a relative motion between a workpiece and the non-parallel ion beam, so as to enable each region of the workpiece to be implanted by different portions of the non-parallel ion beam successively;
    wherein the non-parallel ion beam is a divergent ion beam or a convergent ion beam;
    wherein the step for providing the non-parallel ion beam comprises:
 providing an ion beam; and
    modifying the ion beam into the non-parallel ion beam;
    wherein the ion beam is a parallel ion beam, a divergent ion beam or a convergent ion beam;
    wherein the step for modifying the ion beam into the non-parallel ion beam comprises at least one of the following:
    using at least an optical component to diverge the ion beam into the non-parallel ion beam as a divergent ion beam;
    using at least an optical component to converge the ion beam into the non-parallel ion beam as a convergent ion beam;
    using at least an optical component to converge the ion beam into a convergent ion beam, so as to enable the convergent ion beam to form the non-parallel ion beam as a divergent ion beam after focusing;
    using at least a first optical component to converge the ion beam into a convergent ion beam, and further using at least a second optical component to diverge the convergent ion beam into the non-parallel ion beam as a convergent ion beam;
    using at least a first optical component to converge the ion beam into a convergent ion beam, and further using at least a second optical component to diverge the convergent ion beam into the non-parallel ion beam as a divergent ion beam;
    using at least a first optical component to converge the ion beam into a convergent ion beam, and further using at least a second optical component to converge the convergent ion beam into the non-parallel ion beam as a convergent ion beam;
    using at least a first optical component to diverge the ion beam into a divergent ion beam, and further using at least a second optical component to converge the divergent ion beam into the non-parallel ion beam as a convergent ion beam;
    using at least a first optical component to diverge the ion beam into a divergent ion beam, and further using at least a second optical component to converge the divergent ion beam into the non-parallel ion beam as a divergent ion beam;
    using at least a first optical component to diverge the ion beam into a divergent ion beam, and further using at least a second optical component to diverge the divergent ion beam into the non-parallel ion beam as a divergent ion beam; and
    using at least a first optical component to diverge the ion beam into a divergent ion beam, and further using at least a second optical component to converge the divergent ion beam into a convergent ion beam, so as to enable the convergent ion beam to form the non-parallel ion beam as a divergent ion beam after focusing.

2. The method as claimed in claim 1, wherein at least one three-dimensional structure is located on the upper surface of the workpiece, wherein both the top surface and the side surface of the three-dimensional structure should be implanted.

3. The method as claimed in claim 2, wherein the direction of the relative motion intersects with the top surface and the side surface of the three-dimensional structure.

4. The method as claimed in claim 2, wherein each of the top surface and the side surface of the three-dimensional structure is implanted by different portions of the non-parallel ion beam successively.

5. The method as claimed in claim 1,
    wherein the potential structure of the optical component comprises:
    a magnetic quadruple applying a quadruple magnetic field on the ion beam;
    a magnetic component having a plurality of coils positioned on two separated rods, wherein the two rods are positioned on two opposite sides of the ion beam; and
    an electric element having a plurality of electrodes positioned on two separated rods, wherein the two rods are positioned on two opposite sides on the ion beam.

6. The method as claimed in claim 5, further comprising using different optical components to converge or diverge different portions of the ion beam during modifying the ion beam into the non-parallel ion beam.

7. The method as claimed in claim 1, further comprising at least one of the following before the workpiece being implanted by the non-parallel ion beam:
blanking some ions away the non-parallel ion beam;
decreasing an ion concentration of at least a portion of the non-parallel ion beam;
modifying the non-parallel ion beam uniformly; and
modifying the non-parallel ion beam non-uniformly.

8. The method as claimed in claim 1, further comprising at least one of the following:
wherein the angular difference between the non-parallel ion beam and a parallel ion beam is equal to or smaller than 15 degrees when the ion beam is a spot ion beam, and wherein the angular difference between the non-parallel ion beam and a parallel ion beam is equal to or smaller than 5 degrees when the ion beam is a ribbon ion beam;
when the ion beam is modified into a non-parallel ion beam having a divergent angle, the divergent angle of the non-parallel ion beam is larger than or equal to 3 degrees and smaller than or equal to 10 degrees, larger than 5 degrees and smaller than 15 degrees, not smaller than 4 degrees and not larger than 8 degrees, smaller than 18 degrees and larger than 2 degree, or larger than 8 degrees; and
when the ion beam is modified into a non-parallel ion beam having a convergent angle, the convergent angle of the non-parallel ion beam is larger than or equal to 3 degrees and smaller than or equal to 10 degrees, larger than 5 degrees and smaller than 15 degrees, not smaller than 4 degrees and not larger than 8 degrees, smaller than 18 degrees and larger than 2 degree, or larger than 8 degrees.

9. The method as claimed in claim 1, further comprising at least one of the following during the relative motion between a workpiece and the non-parallel ion beam:
linearly driving the workpiece to move across the non-parallel ion beam; and
driving the workpiece to tilt relative to a transmission path the non-parallel ion beam.

10. A method for implantation, comprising:
providing an integrated ion beam; and
directing the integrated ion beam into a workpiece having at least two three-dimensional structures;
wherein the integrated ion beam consisting of various implant angle distribution;
wherein the integrated ion beam is modified into a non-parallel ion beam by at least one of the following steps:
using at least an optical component to diverge the integrated ion beam into the non-parallel ion beam as a divergent ion beam;
using at least an optical component to converge the integrated ion beam into the non-parallel ion beam as a convergent ion beam;
using at least an optical component to converge the integrated ion beam into a convergent ion beam, so as to enable the convergent ion beam to form the non-parallel ion beam as a divergent ion beam after focusing;
using at least a first optical component to converge the integrated ion beam into a convergent ion beam, and further using at least a second optical component to diverge the convergent ion beam into the non-parallel ion beam as a convergent ion beam;
using at least a first optical component to converge the integrated ion beam into a convergent ion beam and further using at least a second optical component to diverge the convergent ion beam into the non-parallel ion beam as a divergent ion beam;
using at least a first optical component to converge the integrated ion beam into a convergent ion beam and further using at least a second optical component to converge the convergent ion beam into the non-parallel ion beam as a convergent ion beam;
using at least a first optical component to diverge the integrated ion beam into a divergent ion beam, and further using at least a second optical component to converse the divergent ion beam into the non-parallel ion beam as a convergent ion beam;
using at least a first optical component to diverge the integrated ion beam into a divergent ion beam and further using at least a second optical component to converge the divergent ion beam into the non-parallel ion beam as a divergent ion beam;
using at least a first optical component to diverge the integrated ion beam into a divergent ion beam, and further using at least a second optical component to diverge the divergent ion beam into the non-parallel ion beam as a divergent ion beam; and
using at least a first optical component to diverge the integrated ion beam into a divergent ion beam, and further using at least a second optical component to converge the divergent ion beam into a convergent ion beam, so as to enable the convergent ion beam to form the non-parallel ion beam as a divergent ion beam after focusing.

11. The method as claimed in claim 10, the beam current distribution of the IDB is formed as
a horn shape that the beam current is increased from a beam center to the beam edge.

12. The method as claimed in claim 10, further comprising at least one of the following:
the IDB is perpendicularly implanted into the workpiece; and
the IDB is tilted implanted into the workpiece.

13. The method as claimed in claim 10, at least one of the three-dimensional structures has a sidewall not totally perpendicular to the top surface of the workpiece.

14. The method as claimed in claim 10, further comprising at least one of the following:
the divergent angle of the IDB is less than 35 degrees;
the divergent angle of the IDB is equal to or more than 5 degrees and equal to or less than 15 degrees;
the divergent angle of the IDB is equal to or more than 15 degrees or equal to or less than 25 degrees;
the divergent angle of the IDB is larger than 3 degrees;
the convergent angle of the IDB is less than 35 degrees;
the convergent angle of the IDB is equal to or more than 5 degrees and equal to or less than 15 degrees;
the convergent angle of the IDB is equal to or more than 15 degrees or equal to or less than 25 degrees; and
the convergent angle of the IDB is larger than 3 degrees.

* * * * *